(12) United States Patent
Tonomura et al.

(10) Patent No.: US 9,742,207 B2
(45) Date of Patent: *Aug. 22, 2017

(54) CELL PROTECTION SYSTEM

(71) Applicant: Renesas Electronics Corporation, Koutou-ku, Tokyo (JP)

(72) Inventors: Fumio Tonomura, Tokyo (JP); Hideo Ishii, Tokyo (JP); Tsuyoshi Ota, Tokyo (JP)

(73) Assignee: Renesas Electronics Corporation, Koto-ku, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/010,050

(22) Filed: Jan. 29, 2016

(65) Prior Publication Data

US 2016/0149424 A1    May 26, 2016

Related U.S. Application Data

(63) Continuation of application No. 14/070,644, filed on Nov. 4, 2013, now Pat. No. 9,270,128.

(30) Foreign Application Priority Data

Nov. 8, 2012   (JP) .................................. 2012-246769

(51) Int. Cl.
*H02J 7/00* (2006.01)
*G01R 19/00* (2006.01)
(Continued)

(52) U.S. Cl.
CPC ............ *H02J 7/0029* (2013.01); *G01R 19/00* (2013.01); *G01R 31/3606* (2013.01);
(Continued)

(58) Field of Classification Search
CPC ...... H02J 7/0029; G01R 19/00; H01L 27/088; H01L 19/7813; H01L 29/7815; H01L 27/0207; H01M 10/48; H01M 2010/4278
(Continued)

(56) References Cited

U.S. PATENT DOCUMENTS 6,392,859 B1    5/2002   Ohshima et al.
7,495,416 B2 *  2/2009   Sato et al. ............ H02J 7/0031
                                             320/134

(Continued)

FOREIGN PATENT DOCUMENTS

JP    2000299634 A    10/2000
JP    2007066748 A     3/2007
(Continued)

OTHER PUBLICATIONS

Communication dated May 31, 2016 from the Japanese Patent Office in counterpart Application No. 2012-246769.

*Primary Examiner* — Sun Lin
(74) *Attorney, Agent, or Firm* — Sughrue Mion, PLLC

(57) ABSTRACT

A cell protection system includes a charge control MOSFET, a charge current detection MOSFET, a discharge control MOSFET, a discharge current detection MOSFET, a charge current detection resistance, a discharge current detection resistance and a control circuit. The charge current detection MOSFET has a drain and a gate common with the charge control MOSFET. The discharge control MOSFET has a drain common with the charge control MOSFET. The discharge current MOSFET has a drain and a gate common with discharge control MOSFET. The charge current detection resistances and the discharge current detection resistance are provided in correspondence to the charge current detection MOSFET and the discharge current detection MOSFET, respectively. The control circuit generates a gate control signal for the charge control MOSFET and the (Continued)

charge current detection MOSFET by using the charge current detection resistance and generates a gate control signal for the charge control MOSFET and the discharge current detection MOSFET by using the discharge current detection resistance.

14 Claims, 19 Drawing Sheets

(51) Int. Cl.
  *H01M 10/48* (2006.01)
  *H01L 27/088* (2006.01)
  *H01L 29/78* (2006.01)
  *G01R 31/36* (2006.01)
  *H01M 10/42* (2006.01)
  *H01L 27/02* (2006.01)
  *G01R 19/165* (2006.01)

(52) U.S. Cl.
  CPC ........ *H01L 27/088* (2013.01); *H01L 29/7813* (2013.01); *H01L 29/7815* (2013.01); *H01M 10/48* (2013.01); *G01R 19/16519* (2013.01); *G01R 19/16542* (2013.01); *H01L 27/0207* (2013.01); *H01M 2010/4278* (2013.01); *H02J 2007/004* (2013.01); *H02J 2007/0037* (2013.01); *H02J 2007/0039* (2013.01)

(58) Field of Classification Search
  USPC .......................................................... 320/134
  See application file for complete search history.

(56) References Cited

U.S. PATENT DOCUMENTS

| | | |
|---|---|---|
| 2004/0189259 A1 | 9/2004 | Miura et al. |
| 2009/0220825 A1 | 9/2009 | Nakashima et al. |
| 2010/0072604 A1 | 3/2010 | Komatsu et al. |
| 2010/0301811 A1 | 12/2010 | Aiura |
| 2013/0141828 A1 | 6/2013 | Yamaguchi et al. |

FOREIGN PATENT DOCUMENTS

| | | |
|---|---|---|
| JP | 2008-141873 A | 6/2008 |
| JP | 2009-103722 A | 5/2009 |
| JP | 2010-73951 A | 4/2010 |
| JP | 2010-279097 A | 12/2010 |
| JP | 4756557 B2 | 8/2011 |
| JP | 2012050258 A | 3/2012 |
| WO | 2006/114883 A1 | 11/2006 |
| WO | 2006114838 A1 | 11/2006 |

* cited by examiner

CELL PROTECTION SYSTEM

CROSS-REFERENCE

This is a Continuation of U.S. application Ser. No. 14/070,644 filed on Nov. 4, 2013, which claims priority from Japanese Patent Application JP 2012-246769 filed on Nov. 8, 2012. The disclosures thereof are incorporated herein by reference.

TECHNICAL FIELD

The present invention is related to a cell protection system, and especially, to a cell protection system suitable to control a secondary battery.

BACKGROUND ART

In recent years, a small high-capacity secondary battery is used for various electronic equipments such as a mobile phone, a notebook PC and a smart phone. As such a secondary battery, a Li ion cell is exemplified. The secondary battery such as the Li ion cell has a high performance but sometimes causes generation of heat and degradation through over-charge, over-discharge, and short-circuit and so on. Therefore, in order to use such a secondary battery more safely, the protection circuit is necessary. The protection circuit is arranged in the cell pack, monitors over-charge, over-discharge, and over-current, abnormal heat generation and so on and controls the charging and discharging operations.

For example, the protection circuit includes a charge and discharge FET (Field Effect Transistor), a resistance (hereinafter, to be referred to as a "sense resistance"), a temperature detection device and a control circuit. The charge and discharge FET turns on or off a charge and discharge path. As the charge and discharge FET, generally, two MOSFETs (Metal Oxide Semiconductor FETs) having a common drain are formed as a 1-chip circuit. The sense resistance is arranged on the way of the charge and discharge path and detects a charge and discharge current. The temperature detection device detects the temperature of the MOSFET and the protection circuit. As the temperature detection device, a thermistor is exemplified. The control circuit processes data from these detection devices and controls the MOSFETs.

As the cell pack which has such a protection circuit, a pack cell is disclosed in, for example, JP 2007-66748A. This pack cell communicates with a charging device. The pack cell includes a charge FET device. The charge FET device is turned off when the cell is charged up to a full charging state. The control circuit carries out communication processing with the charging device and a control of the charge FET device. In the control circuit, the charge FET device is turned off in the full charging state and is turned on when ii is determined that there no communication with the charging device.

Specifically, this pack cell A includes a secondary battery 1, a charge FET device 91, a discharge FET device 92, a detection resistance (a sense resistance) 2 and a MPU (Micro Processor Unit). The charge FET device 91 and the discharge FET device 92 are connected in series on a power supply path which connects the positive electrode of the secondary battery 1 and the positive terminal (+) of the pack cell A. That is, the drain of the discharge FET device 92 and the drain of the discharge FET device 91 are connected in common. The source of the discharge FET device 92 is connected with the side of the positive electrode of the secondary battery 1. The source of the charge FET device 91 is connected with the positive terminal (+). It should be noted that the gate of the discharge FET device 92 and the gate of the charge FET device 91 are connected with the MPU. Also, the detection resistance 2 (the sense resistance) is provided on a power supply path which connects the negative electrode of the secondary battery 1 and the negative terminal (−) of the pack cell A. The voltage of the detection resistance (the sense resistance) 2 is measured by the MPU.

The discharging operation of this pack cell A can be considered as follows. A load is connected between the positive terminal (+) and the negative terminal (−) in the pack cell A. The MPU turns on the charge FET device 91 and the discharge FET device 92 together by a gate control signal. Thus, the secondary battery 1 begins a discharging operation, so that a discharge current flows through each power supply path. The MPU reads the voltage across the both ends of the detection resistance (the sense resistance) 2 and calculates a discharge current. When the discharge current is larger than a predetermined value, the MPU determines that an extraordinary current flows and turns off the charge FET device 91 and the discharge FET device 92 together by the gate control signal. Thus, a discharge path is blocked off and the discharge current stops. The same operation is carried out when it is determined that the cell voltage reached a desired voltage.

Also, the charging operation of this pack cell A is considered as follows. The charging device is connected between the positive terminal (+) and the negative terminal (−) of the pack cell A. The MPU turns on the charge FET device 91 and the discharge FET device 92 together by the gate control signal. Thus, the secondary battery 1 begins the charging operation and the charge current flows through each power supply path. The MPU reads a voltage across the both ends of the detection resistance (the sense resistance) 2 and calculates a charge current. When the charge current is larger than a predetermined value, the MPU determines that an extraordinary current flows about and the charge FET device 91 and the discharge FET device 92 are turned off together by the gate control signal. Thus, the charge path is blocked off and the charge current stops. The same operation is carried out when it is determined that the cell voltage reached a desired voltage.

As a related technique, a power unit is disclosed in JP 2012-50258A (the international publication WO 2012/026537A1). This power unit includes one or more cell pack and a protection unit. The two or secondary battery connected in serial or in parallel are contained in the one or more cell packs. The protection unit can be electrically connected with the cell pack. The power which is supplied from an external power unit can be stored in each cell pack and is discharged from each cell pack. The cell pack has a pack abnormal output terminal to send a pack extraordinary signal to the protection unit or another cell pack in case of abnormal generation. The protection unit includes a protection-side input/output terminal to be connected with the pack abnormal output terminal and a protection circuit which can block off the current of the cell pack. When a malfunction occurs in the cell pack, a pack extraordinary signal is outputted from the pack abnormal output terminal of the cell pack to the protection-side input/output terminal of the protection unit. The protection unit blocks off the current by the protection circuit when it detects the pack extraordinary signal.

Also, a semiconductor device is disclosed in Japanese Patent 4,756,557 (corresponding to international publication WO 2006/114883A1). This semiconductor device includes a first terminal, a second terminal, a power MOSFET, a current detection means, a resistance means, a comparing circuit and a first MOSFET. The power MOSFET has a drain connected with the first terminal and a source connected with the second terminal. The current detection means detects a current which flows through the power MOSFET. A resistance means is provided between the gate of the power MOSFET and the first terminal. The comparing circuit compares an output signal of the current detection means and a reference signal. The first MOSFET has a gate supplied with the output signal of the comparing circuit, and a drain-source path is connected between the gate of the power MOSFET and the source. The above first terminal and the second terminal can be handled as an external first terminal and an external second terminal.

Also, an AC switching device is disclosed in JP 2000-299634A (corresponding to U.S. Pat. No. 6,392,859B1). This AC switching device is a switching device to use for an AC semiconductor fuse. The switching device includes a p-channel first main semiconductor device and an n-channel second main semiconductor device. The p-channel first main semiconductor device has the first main electrode which is connected with the side of the non-grounding of an AC power supply, the second main electrode provided to oppose to the first main electrode, and a first control electrode which controls the main current which flows through the first and the second main electrode. A first parasitic diode is included which has a cathode region connected with the first main electrode, and an anode region connected with the second main electrode. The n-channel second main semiconductor device has a third main electrode connected with the second main electrode, a fourth main electrode opposing to the third main electrode and connected with the load, and the second control electrode which controls the main current which flows through the third and the fourth main electrodes. A second parasitic diode is included which has an anode region connected with the third main electrode and a cathode region connected with the fourth main electrode.

CITATION LIST

[Patent Literature 1] JP 2007-66748A
[Patent Literature 2] JP 2012-50258A
[Patent Literature 3] Japanese Patent 4,756,557
[Patent Literature 4] JP 2000-299634A

SUMMARY OF THE INVENTION

In the pack cell A of JP 2007-66748A, in the discharging operation of the secondary battery 1, power is consumed by the turn-on resistances of the charge FET device 91 and the discharge FET device 92 and the detection resistance (the sense resistance) 2 as well as the load. In this case, by making the consumed power as small as possible, the efficiency of the secondary battery 1 is improved and the continuous operation time can be elongated. This is same in case of the charging operation.

However, the detection resistance (the sense resistance) 2 is disposed in the power supply path of the charge current and the discharge current in the pack cell A of JP 2007-66748A. Because the charge current and the discharge current flowing through the power supply path is large, wasteful power is consumed in the detection resistance (the sense resistance) 2. Especially, a problem is caused that the continuous operation time of the pack cell A becomes short in the discharging operation. Also, it is necessary to use the detection resistance (the sense resistance) 2 having a small resistance value (e.g. several mΩ and tens of mΩ) in order to suppress the power consumption. Therefore, it is difficult to improve the measurement precision of voltage, and it is a special and expense instrument.

The other subjects and new features will become clear from the following description and the attached drawings of this Specification.

According to one embodiment, in the cell protection system, a charge current detection MOSFET and a discharge current detection MOSFET which have different cell ratios, and a charge current detection resistance and a discharge current detection resistance are provided in parallel to a charge control MOSFET and a discharge control MOSFET on a charge and discharge path of the cell.

According to the embodiment, consumption power is reduced, and the efficiency of the cell is improved, and the continuous operation time can be elongated.

DESCRIPTION OF THE EMBODIMENTS

Hereinafter, a cell protection system according to embodiments will be described with reference to the attached drawings.

[First Embodiment]

Figure 1:
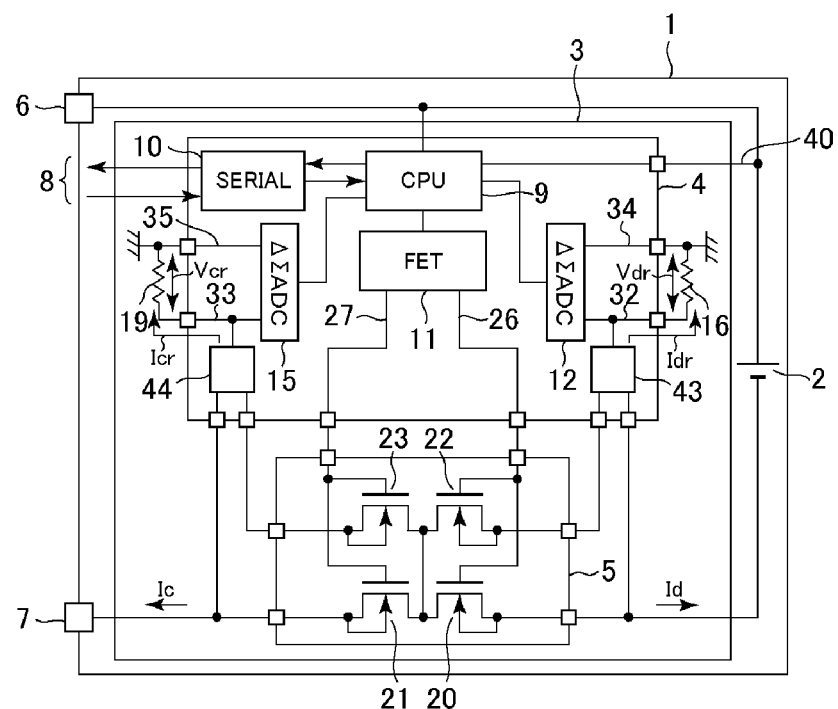
FIG. 1 is a block diagram showing a configuration example of a cell pack to which a cell protection system according to a first embodiment is applied.

The configuration of a cell pack applied with a cell protection system according to a first embodiment will be described. FIG. 1 is a block diagram showing a configuration example of the cell pack applied with the cell protection system according to the first embodiment. A cell pack 1 is a secondary battery system with a charging and discharging operation protection function, and has a terminal 6, a terminal 7, and an interface input/output 8 arranged as external connection terminals. The cell pack 1 has a secondary battery 2, a cell protection system 3, the terminal 6 and the terminal 7.

The secondary battery 2 is a cell in which the charging and discharging operations can be carried out, and for example, is a Li ion cell. A positive electrode of the secondary battery 2 is connected with the terminal 6 through a power supply path (a wiring line for the charging and discharging operations) on the positive side, and a negative electrode is connected with the terminal 7 through a power supply path (a wiring line for the charging and discharging operations) on the negative side. The secondary battery 2 carries out the charging and discharging operations through the terminal 6, the terminal 7 and the power supply paths (the wiring lines for the charging and discharging operations). The secondary battery 2 is protected from abnormality such as over-current by controlling the charging and discharging operations by a cell protection system 3 provided on the way of the wiring line for the charging and discharging operations.

The cell protection system 3 includes a charge control MOSFET 21, a charge current detection MOSFET 23, a discharge control MOSFET 20, a discharge current detection MOSFET 22, a charge current detection resistance 19, a discharge current detection resistance 16 and a control circuit 4. The charge current detection MOSFET 23 and the charge control MOSFET 21 have a drain and a gate which are common to them, and are different from each other in a cell ratio. The discharge control MOSFET 20 and the charge control MOSFET 21 have a drain common to them. The discharge current detection MOSFET 22 and the discharge control MOSFET 20 have a drain and a gate and differ from each other in a cell ratio. The charge current detection resistance 19 is provided in correspondence to the charge current detection MOSFET 23 (which is electrically connected with a source of the charge current detection MOSFET 23). The discharge current detection resistance 16 is provided in correspondence to the discharge current detection MOSFET 22 (which is electrically connected with a source of the discharge current detection MOSFET 22). The control circuit 4 generates a control signal to be supplied to gates of the charge control MOSFET 21 and the charge current detection MOSFET 23 through digital signal processing which is based on a voltage value of the charge current detection resistance 19, and generates a control signal to be supplied to gates of the discharge control MOSFET 20 and the discharge current detection MOSFET 22 through digital signal processing which is based on a voltage value of the discharge current detection resistance 16. However, a case where the gate is common contains a case where the wiring lines are different but a same voltage is supplied to the gates in addition to a case that the wiring lines to the drains and the gates are common.

In such a cell protection system 3, the charge control MOSFET 21 and the charge current detection MOSFET 23 constitute a current mirror circuit. That is, a charge current Ic of the charge control MOSFET 21 and a detection current Icr which is based on the cell ratio of both of the MOSFETs are supplied to the charge current detection resistance 19 from the charge current detection MOSFET 23. Therefore, the detection current Icr can be made very small by adjusting the cell ratio, so that wasteful power consumption due to the charge current detection resistance 19 can be suppressed to make it possible to elongate continuous operation time. In the same way, in such a cell protection system 3, the discharge control MOSFET 20 and the discharge current detection MOSFET 22 configure a current mirror circuit. That is, a discharge current Id of the discharge control MOSFET 20 and a detection current Idr which is based on the cell ratio of both MOSFETs are supplied to the discharge current detection resistance 16 from the discharge current detection MOSFET 22. Therefore, the detection current Idr can be made very small by adjusting the cell ratio, so that wasteful power consumption due to the discharge current detection resistance 16 can be suppressed to make it possible to elongate continuous operation time. The cell pack 1 using the cell protection system 3 can suppress the wasteful power consumption in the charging and discharging operations and can extend continuous operation time. Also, because the gate of each MOSFET is controlled through the digital signal processing, a voltage value is variously processed to use for a control in addition to the control determined in the circuit. That is, the degrees of freedom of the control can be improved.

Specifically, the cell protection system 3 includes the control circuit 4, the cell protection FET circuit 5 and the current detection resistances 16 and 19.

The cell protection FET circuit 5 controls the charging and discharging operations of the secondary battery 2 based on the control of the control circuit 4 and protects the secondary battery 2 appropriately. The cell protection FET circuit 5 may be provided as a 1-chip semiconductor circuit. The adoption of the 1-chip semiconductor circuit decreases a deviation of electric characteristics and the handling becomes easy. The cell protection FET circuit 5 includes the MOSFET 20, the MOSFET 21, the MOSFET 22, and the MOSFET 23.

The MOSFET 20 carries out an ON/OFF control of the power supply path through which the discharge current Id flows in case of the discharging operation. That is, the MOSFET 20 is the discharge control MOSFET and the MOSFET 22 outputs the detection current Idr corresponding to the discharge current Id. The MOSFET 22 is the discharge current detection MOSFET. However, the following relation is satisfied: the discharge current Id>>the detection current Idr. The drains and the gates are respectively connected in common between the MOSFET 20 and the MOSFET 22. The gates connected in common between the MOSFET 20 and the MOSFET 22 can be connected with an external wiring line through a terminal and the sources thereof can be connected with another external wiring line through another terminal.

The source of the MOSFET 20 is connected with the negative pole of the secondary battery 2. The source of the MOSFET 22 is connected with the current detection resistance 16 through the control circuit 4. The gates of the MOSFET 20 and the MOSFET 22 are connected with an FET control section 11. The number of unit cells of the MOSFET 20 and the number of unit cells of the MOSFET 22 satisfy the following relation: the number of unit cell of the MOSFET 20>>the number of unit cells of the MOSFET 22. Regarding a ratio of the number of unit cells number ratio, large: small. The discharge current Id flows through the MOSFET 20, whereas the detection current Idr (<<Id) flows through the MOSFET 22, in order to suppress consumption power low. For example, it is supposed that the ratio of the number of unit cells of the MOSFET 20 and the number of unit cells of the MOSFET 22 is 20000:1. It should be noted that the ratio of the discharge current Id and the detection current Idr may be a ratio of the gate widths (or the channel widths) between the MOSFET 20 and the MOSFET 22, in place of the ratio of the numbers of unit cells.

The MOSFET 21 carries out an ON/OFF control of the power supply path through which charge current Ic flows in the charging operation. The MOSFET 21 is the charge control MOSFET and the MOSFET 23 outputs the detection current Icr corresponding to charge current Ic. The MOSFET 23 is the charge current detection MOSFET. Here, the following relation is satisfied: the charge current Ic>>the detection current Icr. The drains and the gates are respectively connected in common between the MOSFET 21 and the MOSFET 23. The drains and the gates are respectively connected in common between the MOSFET 20 and the MOSFET 22. The gates of the MOSFET 21 and the MOSFET 23 are possible to be connected with an external wiring line through a terminal and the sources thereof are possible to be connected with another external wiring line through another terminal. The source of the MOSFET 21 is connected with the terminal 7. The source of the MOSFET 23 is connected with the current detection resistance 19 through the control circuit 4. The gates of the MOSFET 20 and the MOSFET 22 are connected with the FET control section 11. The number of unit cells of the MOSFET 21 and the number of unit cells of the MOSFET 23 satisfy the following relation: the number of unit cells of the MOSFET 21>>the number of unit cells of the MOSFET 23. Regarding the ratio of the number of unit cells, large number:small number. The charge current Ic flows through the MOSFET 21 whereas the detection current Icr (<<Ic) flows through the MOSFET 23, in order to suppress consumption power low. For example, it is supposed that the ratio of the number of unit cells of the MOSFET 21 and the number of unit cells of the MOSFET 23 is 20000:1. It should be noted that a ratio of the charge current Ic and the detection current Icr may be a ratio of the gates widths (or the channel widths) of the MOSFET 21 and the MOSFET 23, in place of the ratio of the numbers of unit cells.

The control circuit 4 calculates a charge electric quantity or a discharge electric quantity through the digital signal processing based on an external control and a measurement result, determines an abnormality in the charging and discharging operations, and controls the cell protection FET circuit 5 based on these quantities. The control circuit 4 may be provided as 1-chip semiconductor circuit. The control circuit 4 includes a current control circuit 43, a current control circuit 44, an ADC 12, an ADC 15, the FET control section 11, a serial IF 10, and a CPU (Central Processing Unit) 9.

The current control circuit 43 is connected with the power supply path (the source of the MOSFET 20), the source of the MOSFET 22 and one end of the current detection resistance 16. The detection current Idr is supplied to the current detection resistance 16 from the MOSFET 22 so that the source of the MOSFET 20 and the source of the MOSFET 22 become equal in potential. The current control circuit 44 is connected with the power supply path (the source of the MOSFET 21), the source of the MOSFET 23 and one end of the current detection resistance 19. The detection current Icr is supplied to the current detection resistance 19 from the MOSFET 23 so that the source of the MOSFET 21 and the source of the MOSFET 23 become equal in potential.

The ADC (Analog/Digital Converter) 12 converts an analog potential value of the current detection resistance 16 when the detection current Idr flows, into a digital value and outputs it to the CPU 9. The ADC 12 is an discharge current detection ADC, and is provided in correspondence to the current detection resistance 16 which is used to detect the detection current Idr which flows through the discharge current detection MOSFET 22. The ADC 15 converts an analog potential value of the current detection resistance 19 when the detection current Icr flows, into a digital value, and outputs it to the CPU 9. The ADC 15 is an ADC of the charge current detection, and is provided in correspondence to the current detection resistance 19 which detects the detection current Icr which flows through the charge current detection MOSFET 23. In this way, the potentials of the detection resistances can be processed in the CPU 9 by arranging the ADCs 12 and 15.

The FET control section 11 is connected with the gates of the MOSFET 20, the MOSFET 22, the MOSFET 21 and the MOSFET 23 in the cell protection FET circuit 5. The FET control section 11 controls the gate voltage of each MOSFET in the cell protection FET circuit 5 based on the control of the CPU 9, to turn on/off each MOSFET. The serial IF 10 is an interface used when the CPU 9 exchanges information (the control signal, the measurement result and so on) with an external circuit. The serial IF 10 includes an interface input/output 8 as an external connection terminal. The CPU 9 controls the ADC 12, the ADC 15, the FET control section 11 and the serial IF 10. For example, the CPU 9 outputs a signal to control the cell protection FET circuit 5 based on the measurement results of the ADC 12 and the ADC 15 to the FET control section 11. Also, for example, the CPU 9 outputs the measurement results and a calculation result through the serial IF 10 to the outside based on the measurement results of the ADC 12 and the ADC 15. In this way, the charging and discharging operations of the secondary battery 2 can be controlled by the CPU 9 and the FET control section 11 through the control of the cell protection FET circuit 5.

The one end of the current detection resistance 16 is connected with the source of the MOSFET 22 of the cell protection FET circuit 5 through the current control circuit 43 of the control circuit 4 and the other end thereof is connected with the GND. Moreover, both the ends of the current detection resistance 16 are connected with the ADC 12. The current detection resistance 16 is a resistance for the discharge current detection, and is provided in correspondence to the discharge current detection MOSFET 22. The one end of the current detection resistance 19 is connected with the source of the MOSFET 23 of the cell protection FET circuit 5 through the current control circuit 44 of the control circuit 4 and the other end thereof is connected with the GND. Moreover, both the ends of the current detection resistance 19 are connected with the ADC 15. The current detection resistance 19 is a resistance for the charge current detection, and is provided in correspondence to the charge current detection MOSFET 23. The current detection resistance 16 or 19 may be provided as an independent element.

Figure 2:
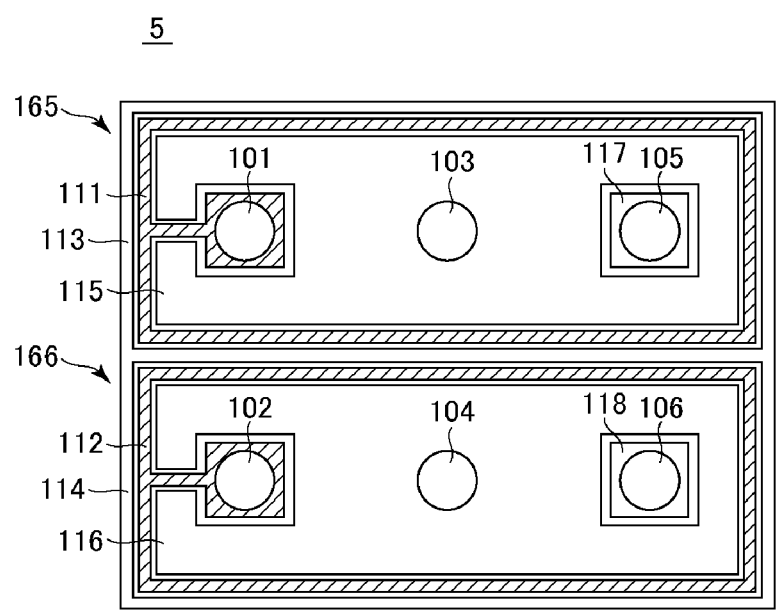
FIG. 2 is a plan view showing an example of the configuration of a cell protection FET circuit shown in FIG. 1.

FIG. 2 is a plan view showing a configuration example of the cell protection FET circuit 5 shown in FIG. 1. For example, here, an area 165 corresponds to the charge control MOSFET 21 and the charge current detection MOSFET 23. An area 166 corresponds to the discharge control MOSFET 20 and the discharge current detection MOSFET 22. Because the area 165 and the area 166 are symmetrical with respect to the centerline and have the same configuration, the area 165 will be mainly described below.

What surrounds the area 165 is euqipotential ring 113. For breakdown voltage improvement of the chip edge and the separation from the MOSFET, the euqipotential ring 113 is an area having the same potential as the drain. It should be noted that the euqipotential ring 113 and the euqipotential ring 114 surrounding the area 166 share a location where the area 166 and the area 165 contact.

A ring-like gate wiring line 111 is disposed along the euqipotential ring 113 inside the euqipotential ring 113. A ring-like trench is disposed along the ring-like gate wiring line 111 in a surface area of the semiconductor substrate under the gate wiring line 111. A ring-like gate electrode is embedded in the ring-like trench. The gate electrode is connected with the gate wiring line 111 through contacts. The gate electrode is covered with a gate insulating film in the side surface and the bottom surface.

Also, a stripe-like trench (a plurality of trenches) is provided along a longitudinal direction in the surface area of the semiconductor substrate under the area surrounded with the ring-like gate wiring line 111 (not shown). A plurality of gate electrodes are embedded in the plurality of trenches. The plurality of gate electrodes are connected with the ring-like gate electrodes which surround them at both the ends in the longitudinal direction. Each gate electrode is covered with the gate insulating film in the side surface and the bottom surface. An outer area from the gate insulating film which contacts the side surface of each gate electrode functions as the source and a channel. An outer area from the gate insulating film which contacts the bottom surface of each gate electrode functions as the drain. That is, an area having a predetermined width from the gate electrode can be regarded as an MOSFET cell. In other words, the plurality of MOSFET cells are disposed in the area surrounded with the ring-like gate wiring line 111. The gate electrodes of the plurality of MOSFET cells are connected with the gate wiring line 111 through the ring-like gate electrode.

Similarly, the plurality of MOSFET cells are provided in the surface area of the semiconductor substrate under the area surrounded with the ring-like gate wiring line 112.

Figure 3:
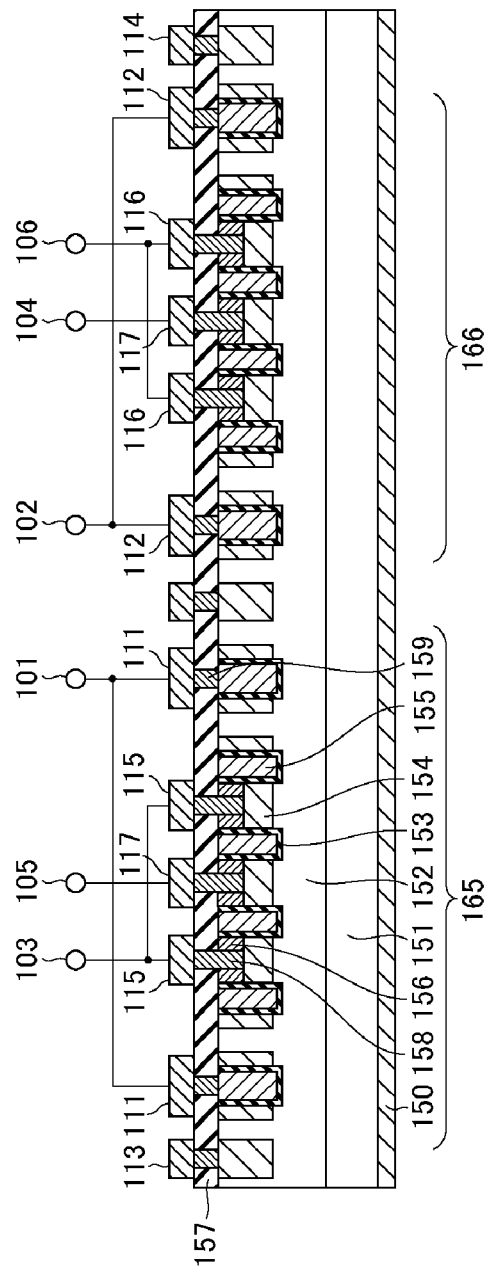
FIG. 3 is a sectional view showing a configuration example of the cell protection FET circuit shown in FIG. 1.

The plurality of MOSFET cells in the area surrounded with the gate wiring line configure the charge control MOSFET 21 and the charge current detection MOSFET 23. For example, it is supposed that a MOSFET cell in a predetermined area of the area surrounded with the gate wiring line 111 is the MOSFET 23. Also, it is supposed that a MOSFET cell in the remaining portion of the area surrounded with the gate wiring line 111 is the MOSFET 21. Separation between these MOSFETs is carried out through the separation of the source electrode. AS shown in FIG. 2, the source electrode 115 of the MOSFET 21 and the source electrode 117 of the MOSFET 23 are separated. The section of each MOSFET is shown later (FIG. 3). For example, at this time, a ratio of the area of the MOSFET 23 (equivalent to the number of unit cells) and the area of the MOSFET 21 (equivalent to the number of unit cells) can be made 1:20000.

In the same way, the plurality of MOSFET cells in the area surrounded with the gate wiring line 112 configure the discharge control MOSFET 20 and the discharge current detection MOSFET 22. The source electrode 116 of the MOSFET 20 and the source electrode 118 of the MOSFET 22 are separated, so that the MOSFETs are separated. For example, a ratio of the area of the MOSFET 22 (equivalent to the number of unit cells) and the area of the MOSFET 20 (equivalent to the number of unit cells) can be made 1:20000.

The source of the MOSFET cell as the MOSFET 23 is connected with a source electrode 117 through the contact. The source electrode 117 is connected with a source terminal 105. On the other hand, the source of the MOSFET cell as the MOSFET 21 is connected with a source electrode 115 through the contact. The source electrode 115 is connected with a source terminal 103. The gate of the MOSFET cell as the MOSFET 23 and the gate of the MOSFET cell as the MOSFET 21 are connected with the gate wiring line 111 through the contact. The gate wiring line 111 is connected with a gate terminal 101. Although explanation is omitted, a similar configuration is adopted for the MOSFET 22 and the MOSFET 20. It should be noted that the drain electrode is common to the MOSFETs 21 and 23 and is provided on the back side of the semiconductor chip.

It should be noted that the area 166 is surrounded with the euqipotential ring 114. The gate wiring line 112 which is common to the discharge control MOSFET 20 and the discharge current detection MOSFET 22, the gate terminal 102, the source electrode 118 of the MOSFET 22 and the source terminal 106 are provided in an area 166. Moreover, the source electrode 116 of the MOSFET 20 and the source terminal 104 are provided. It should be noted that the drain electrode is common to the MOSFETs 20 and 22 and is provided for the back side of the semiconductor chip.

FIG. 3 is a sectional view schematically showing a configuration example of the cell protection FET circuit 5 shown in FIG. 1. It should be noted that for the easy understanding, the configuration is simplified. Therefore, the relative size (e.g. a ratio of the number of unit cells among the MOSFETs (an area ratio of the gates)) of each configuration differs from FIG. 2. For example, the area 165 corresponds to the charge control MOSFET 21 and the charge current detection MOSFET 23 like FIG. 2. The area 166 corresponds to the discharge control MOSFET 20 and the discharge current detection MOSFET 22. The area 165 will be mainly described here, like FIG. 2.

An N+-type semiconductor substrate 151 includes an N-type epitaxial layer 152 on the upper side and a back electrode 150 in the back side. The P layer 154 is embedded in the N-type epitaxial layer 152. The gate electrode 155 and an N+ layer 156 are embedded in the P layer 154. The gate electrode 155 has the structure in which a polysilicon layer is embedded in the gate trench, and the side surface and bottom surface of the gate electrode is covered with the gate insulating film 153 in the side surface and the bottom surface. The gate electrode 155 protrudes from the P layer 154 to the N-type epitaxial layer 152 of the bottom portion. The surface of the N-type epitaxial layer 152 is covered with the interlayer insulating layer 157. The euqipotential ring 113, the gate wiring line 111, the source electrode 115, 117 are formed on the interlayer insulating layer 157. The euqipotential ring 113 is connected with the P layer 154 through a contact 158. The gate wiring line 111 is connected with the gate electrode 155 through a contact 159. The source electrodes 115 and 117 are connected with the N+ layer 156 through the contact 158.

The N+ layer 156 corresponds to the source of the MOSFET. The gate electrode 155 corresponds to the gate electrode of the MOSFET, and the gate insulating film 153 corresponds to the gate insulating film of the MOSFET. The P layer 154 corresponds to the channel of the MOSFET. The N-type epitaxial layer 152 and the N+-type semiconductor substrate 151 correspond to the drain and the drain electrode of the MOSFET. It should be noted that the N-type epitaxial layer 152 as a drain, and the N+-type semiconductor substrate 151 as the drain electrode and the back electrode 150 are common to all the MOSFETs. It should be noted that the resistance value of the N+-type semiconductor substrate 151 is enough small, the back electrode 150 is not always necessary.

The source electrode 115 of the MOSFET 21 is connected with the N+ layer 156 as the source through the contact 158 and is handled as the source terminal 103. The source electrode 117 of the MOSFET 23 is connected with the N+ layer 156 as the source through the contact 158 and is handled as the source terminal 105. The gate electrodes 155 of the MOSFETs are connected to each other, and are connected with the gate electrode 155 under the gate wiring line 111, and are taken out as the gate terminal 101 through the gate wiring line 111. In the same way, the MOSFET 20 includes the source electrode 116 and the source terminal 106. The MOSFET 22 includes the source electrode 117 and the source terminal 104. The MOSFET 20 and the MOSFET 22 further have the gate wiring line 112 and the gate terminal 102 which are common to the MOSFETs 20 and 22. The separation between the area 165 and the area 166 is carried out by forming the same configuration as the peripheral euqipotential rings 113 and 114 in the central portion like FIG. 3 and it should separate it. However, a structure may be adopted in which the gate wiring line 111 and the gate wiring line 112 are only separated through the N-type epitaxial layer 152 without providing the same structure as the euqipotential ring in the central portion.

In other words, the configuration of the MOSFET 21 is as follows. The source and the source electrode are the N+ layer 156 and the source electrode 115. The gate insulating film, the gate electrode and the gate wiring line are the gate insulating film 153, the gate electrode 155 and the gate wiring line 111. The drain and the drain electrode are the N-type epitaxial layer 152, the N+-type semiconductor substrate 151 and the back electrode 150. The channel is in the P layer 154. The configuration of the MOSFET 23 is as follows. The source and the source electrode are the N+ layer 156 and the source electrode 117. The gate insulating film, the gate electrode and the gate wiring line are the gate insulating film 153, the gate electrode 155 and the gate wiring line 111. The drain and the drain electrode are the N-type epitaxial layer 152, the N+-type semiconductor substrate 151 and the back electrode 150. The channel is in the P layer 154. The configuration of the MOSFET 20 is same as the configuration of the MOSFET 21. The configuration of the MOSFET 22 is same as the configuration of the MOSFET 23. Since the MOSFETs 20 to 23 are formed at the same time, a deviation in electric characteristics can be made small.

Generally, in various electronic equipments such as a mobile phone, a notebook type PC, and a smart phone, a low consumption power and the elongation of the continuous operation time (time usable in once charge) is requested. For example, specifically, in case of the cell protection FET circuit 5, the low turn-on resistance of the MOSFET is required.

In the present embodiment, as shown in FIG. 2 and FIG. 3, a flip chip implementation is assumed for the cell protection FET circuit 5 and a CSP (Chip size package) type configuration is adopted in which pads (gate terminals 101 and 102, source terminals 103 to 106) are provided on the chip. As a result, the path of the gate and the source does not become long so that the turn-on resistance of the MOSFET can be suppressed low. Moreover, because the drain of each MOSFET is connected on the back side, it is not necessary to provide a drain electrode on the front surface. Therefore, the path of the drain does not become long so that the turn-on resistance of the MOSFET can be suppressed low. Also, because it is not necessary to provide the drain electrode of each MOSFET on the front surface, an effective cell area can be made wide so that there is no problem that the chip size becomes big.

FIG. 2 is a diagram showing the 6-terminal CSP type semiconductor chip of three terminals by two lines. The three terminals of the gate terminal 101 which is common to the charge control MOSFET 21 and the charge current detection MOSFET 23, the source terminal 103 of the charge control MOSFET 21 and the source terminal 105 of the charge current detection MOSFET 23 are arranged in one line. In parallel to this arrangement, the three terminals of the gate terminal 102 which is common to the discharge control MOSFET 20 and the discharge current detection MOSFET 22, the source terminal 104 of the discharge control MOSFET 20 and the source terminal 106 of the discharge current detection MOSFET 22 are arranged in one line. A wiring line is formed in a protection substrate 3a of FIG. 5 (to be later shown), but by arranging the terminals in this way, a layout of the wiring lines on the side of the protection substrate 3a corresponding to these terminals becomes easy.

Next, the operation of the cell pack to which the cell protection system according to the present embodiment is applied will be described.

The discharging operation of the cell pack 1 includes at least three steps. The first step is a step of turning on the discharge control MOSFET 20, the discharge current detection MOSFET 22 and the charge control MOSFET 21. Thus, the discharge current Id flows through the discharge control MOSFET 20 (power supply path), and the detection current Idr corresponding to the discharge current Id and the cell ratio flows through the discharge current detection MOSFET 22. The second step is a step of measuring the voltage of the discharge current detection resistance 16. Thus, the detection current Idr is obtained. The third step is a step of calculating the discharge current Id of the secondary battery 2 based on the voltage of the discharge current detection resistance 16. Thus, the discharge current Id is obtained and the discharge electric quantity and so on are calculated by accumulating the discharge current.

Also, the charging operation of the cell pack 1 includes at least three steps. The first step is a step of turning on the charge control MOSFET 21, the charge current detection MOSFET 23 and the discharge control MOSFET 20. Thus, the charge current Ic flows through the charge control MOSFET 21 (power supply path), and the detection current Icr corresponding to the charge current Ic and the cell ratio flows through the charge current detection MOSFET 23. The second step is a step of measuring the voltage of the charge current detection resistance 19. Thus, the detection current Icr is obtained. The third step is a step of calculating the charge current Ic of the secondary battery 2 based on the voltage of the charge current detection resistance 19. Thus, the charge current Ic is obtained, and the charge electric quantity and so on are calculated by accumulating the charge current.

In an operation method of such a cell pack 1, the detection current Idr which is based on the discharge current Id of the discharge control MOSFET 20 and the cell ratio of both MOSFETs in case of the discharging operation is supplied to the discharge current detection resistance 16 from the discharge current detection MOSFET 22. Therefore, the detection current Idr can be made very small by adjusting the cell ratio, wasteful power consumption due to the discharge current detection resistance 16 can be suppressed and the continuous operation time can be elongated. Also, the detection current Icr which is based on the charge current Ic of the charge control MOSFET 21 and the cell ratio of both the MOSFETs in case of charging operation is supplied to the charge current detection resistance 19 from the charge current detection MOSFET 23. Therefore, the detection current Icr can be made very small by adjusting the cell ratio, wasteful power consumption due to the charge current detection resistance 19 can be suppressed and the continuous operation time can be elongated.

Hereinafter, the discharge state and the charging state of the cell pack 1 will be described in detail.

First, the discharge operation of the cell pack 1 will be described. A load (not shown) is connected between the terminal 6 and the terminal 7. The CPU 9 instructs the FET control section 11 to connect a discharge path. The FET control section 11 outputs the gate control signal 26 and the gate control signal 27 in an H level to the cell protection FET circuit 5. The MOSFET 20 and the MOSFET 22 are turned on in response to the gate control signal 26 in the H level. Moreover, the MOSFET 21 and the MOSFET 23 are turned on in response to the gate control signal 27 in the H level. Thus, the discharge path between the secondary battery 2 and the terminal 7 are connected and the discharge current Id flows in the direction of the arrow in FIG. 1. That is, the secondary battery 2 becomes a discharge state.

At this time, the current control circuit 43 operates such that the source voltage of the MOSFET 20 and the source voltage of the MOSFET 22 become equal to each other. Because the drains and the gates are respectively connected in common between the MOSFET 20 and the MOSFET 22, these MOSFETs operate as a current mirror circuit. Here, it is supposed that a ratio of the number of unit cells of the MOSFET 20 and the number of unit cells of the MOSFET 22 is 20000:1. In this case, the detection current Idr of 1/20000 of the discharge current Id which flows through the MOSFET 20 flows through the current detection resistance R16 through the MOSFET 22 and the current control circuit 43. The ADC 12 reads (analog signal) the voltage Vdr across the both ends of the current detection resistance R16, and converts the read result into a digital signal to output to the CPU 9. The CPU 9 calculates the discharge current Id that it (Id=Vdr/R16×20000), and calculates the electric quantity used by accumulating the discharge current Id. Then, the CPU 9 calculates a residual quantity of the secondary battery 2 by subtracting the used electric quantity from the electric quantity stored in the charging operation (stored in the CPU 9 or an external storage section). The CPU 9 outputs the calculated residual quantity of the secondary battery 2 to an external equipment through the serial IF 10.

Also, the CPU 9 determines the over-current when the discharge current Id exceeds a predetermined value (stored in the CPU 9 or the external storage section) and instructs the FET control section 11 to block off the discharge path. The FET control section 11 outputs the gate control signal 26 in an L level to the cell protection FET circuit 5. The MOSFET 20 is turned off in response to the gate control signal 26 in the L level. Thus, the discharge path between the secondary battery 2 and the terminal 7 is blocked off to stop the discharge current Id. That is, the discharge from the secondary battery 2 is stopped.

Also, the CPU 9 determines a lack of the residual quantity of the secondary battery 2 when a cell voltage 40 becomes less than a predetermined value (stored in the CPU 9 or in the external storage section), instructs the FET control section 11 to block off the discharge path. The FET control section 11 outputs the gate control signal 26 in the L level to the cell protection FET circuit 5. The MOSFET 20 is turned off in response to the gate control signal 26 in the L level. Thus, the discharge path between the secondary battery 2 and the terminal 7 is blocked off and the discharge current Id gets not to flow. That is, discharge from the secondary battery 2 is stopped.

Next, the charging operation of the cell pack 1 will be described. The positive electrode of a charging device (not shown) is connected with the terminal 6 on the side of the positive electrode of the secondary battery 2, and the negative electrode of the charging device is connected with the terminal 7 on side of the negative electrode of the secondary battery 2. The CPU 9 instructs the FET control section 11 to connect a charge path. The FET control section 11 outputs the gate control signal 26 and the gate control signal 27 in the H level to the cell protection FET circuit 5. The MOSFET 20 and the MOSFET 22 are turned on in response to the gate control signal 26 in the H level. Moreover, the MOSFET 21 and the MOSFET 23 are turned on in response to the gate control signal 27 in the H level. Thus, the charge path between the secondary battery 2 and the terminal 7 is connected and the charge current Ic flows in the direction of the arrow in FIG. 1. That is, the secondary battery 2 is the charging operation.

At this time, the current control circuit 44 operates such that the source voltage of the MOSFET 21 and the source voltage of the MOSFET 23 become equal to each other. Because the drains and the gates are respectively connected in common between the MOSFET 21 and the MOSFET 23, these MOSFETs operate as a current mirror circuit. Here, it is supposed that the ratio of the number of unit cells of the MOSFET 21 and the number of unit cells of the MOSFET 23 is 20000:1. In this case, the detection current Icr of 1/20000 of the charge current Ic which flows through the MOSFET 21 flows through the current detection resistance R19 through the MOSFET 23 and the current control circuit 44. The ADC 15 reads (analog signal) the voltage Vcr across the both ends of the current detection resistance R19, and converts the read result into a digital signal to output to the CPU 9. The CPU 9 calculates the charge current Ic (Ic=Vcr/R19×20000) and calculates an electric quantity stored in the secondary battery 2 by accumulating the calculated charge current Ic. Then, the CPU 9 calculates the residual quantity of the secondary battery 2 by adding the stored electric quantity to the electric quantity left in case of the discharging operation (stored in the CPU 9 or the external storage section). The CPU 9 outputs the calculated residual quantity of the secondary battery 2 to the external equipment through the serial IF 10.

Also, the CPU 9 determines the over-current when the charge current Ic exceeds the predetermined value (stored in the CPU 9 or the external storage section), and instructs the FET control section 11 to block off the charge path. The FET control section 11 outputs the gate control signal 27 in the L level to the cell protection FET circuit 5. The MOSFET 21 is turned off in response to the gate control signal 27 in the L level. Thus, the charge path between the secondary battery 2 and the terminal 7 is blocked off and the charge current Ic gets not to flow. That is, the charging operation of the secondary battery 2 is stopped.

Also, the CPU 9 determines that the secondary battery 2 is sufficiently charged (full charge) when the cell voltage 40 exceeds a predetermined value (stored in the CPU 9 or the external storage section) and instructs the FET control section 11 to block off the charge path. The FET control section 11 outputs the gate control signal 27 in the L level to the cell protection FET circuit 5. The MOSFET 21 is turned off in response to the gate control signal 27 in the L level. Thus, the charge path between the secondary battery 2 and the terminal 7 is blocked off and the charge current Ic gets not to flow. That is, the charging operation of the secondary battery 2 is stopped.

As mentioned above, the cell pack operates to which the cell protection system according to the present embodiment is applied.

Figure 4:
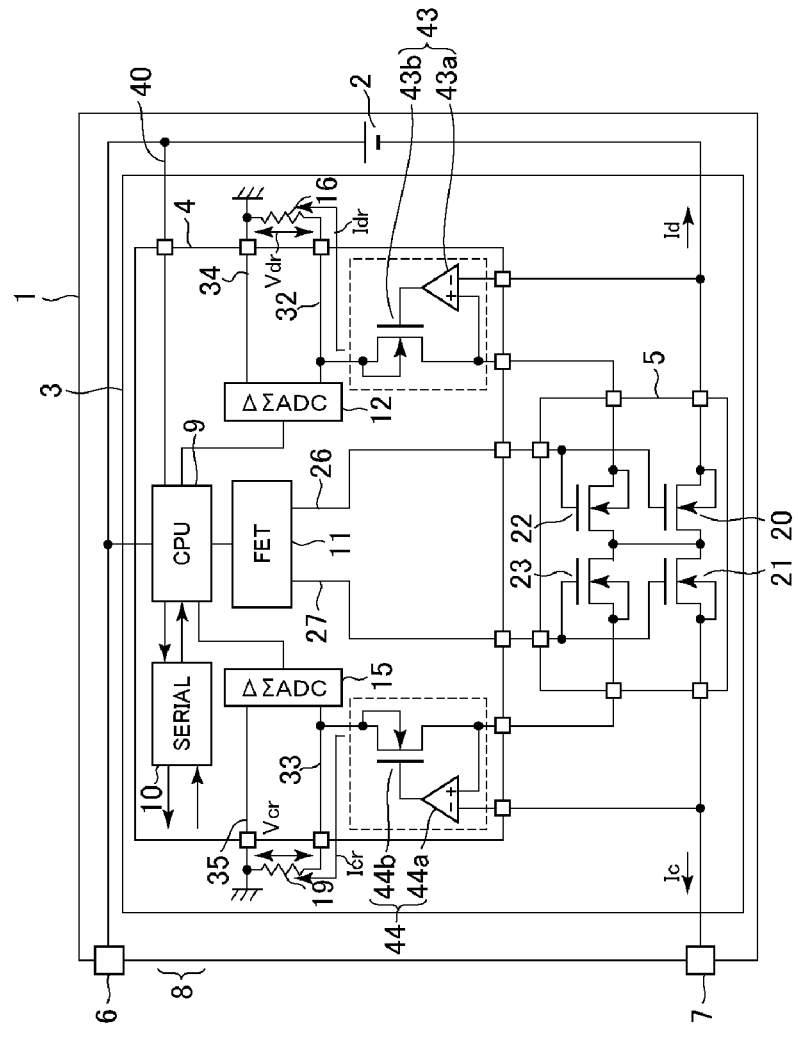
FIG. 4 is a block diagram showing a specific instance of a current control circuit in the configuration of the cell pack of FIG. 1.

FIG. 4 is a block diagram showing a specific instance of the current control circuit in the configuration of the cell pack shown in FIG. 1. For example, the current control circuit 43 may have an operational amplifier 43a and a MOSFET 43b. The operational amplifier 43a is connected with the gate of the MOSFET 43b at an output section, the source of the MOSFET 22 at a non-inversion input section, and the source of the MOSFET 20 at the inversion input section. The MOSFET 43b is connected with the ADC 12 and the current detection resistance 16 at the source and the source of the MOSFET 22 at the drain. Thus, the detection current Idr flows from the source of the MOSFET 22 into the current detection resistance 16 such that the source of the MOSFET 22 and the source of the MOSFET 20 become euqipotential.

For example, the current control circuit 44 may have an operational amplifier 44a and a MOSFET 44b. The operational amplifier 44a is connected with the gate of the MOSFET 44b at the output section, the source of the MOSFET 23 at the non-inversion input section, and the source of the MOSFET 21 at the inversion input section. The MOSFET 44b is connected with the ADC 15 and the current detection resistance 19 at the source and the source of the MOSFET 23 at the drain. Thus, the detection current Icr can flow into the current detection resistance 19 from the MOS-FET 23 such that the source of the MOSFET 21 and the source of the MOSFET 23 become euqipotential.

Figure 5:
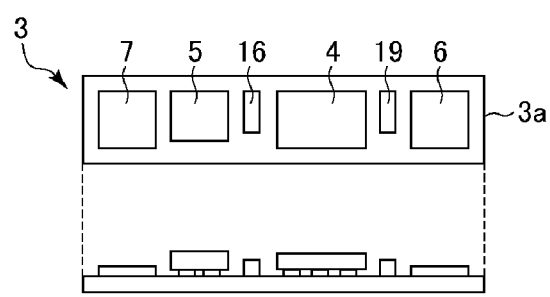
FIG. 5 is a plan view and a side view schematically showing an example when a cell protection system according to the first embodiment is installed on a protection substrate.
Figure 6:
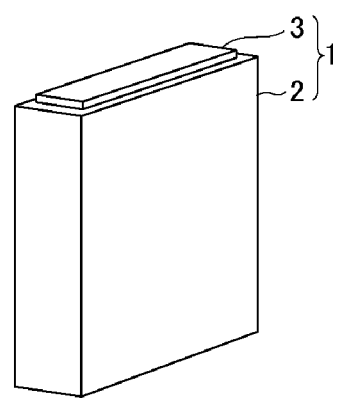
FIG. 6 is a perspective view schematically showing an example of the cell pack on which the cell protection system according to the first embodiment is installed.

FIG. 5 is a plan view and a side view schematically showing an example of a protection substrate on which the cell protection system according to the present embodiment is implemented. FIG. 6 is a perspective view schematically showing an example of the cell pack in which the cell protection system according to the present embodiment is implemented. Between the terminal 6 and the terminal 7 on a thin rectangular protection substrate 3a, the cell protection FET circuit 5, the current detection resistance 16, the control circuit 4 and the current detection resistance 19 are arranged in this order as the cell protection system 3. Also, the terminal 6 and the terminal 7 are disposed on the protection substrate 3a. Here, wiring lines among the components are omitted. The cell pack 1 includes the secondary battery 2 and the cell protection system 3 (which is implemented on the protection substrate 3a) coupled to the side of the secondary battery 2. The positive electrode and the negative electrode of the cell are provided in the side of the secondary battery 2 (not shown). The cell protection system 3 is connected with the side of the secondary battery 2 in the back of the protection substrate 3a by wiring lines (not shown) which passes through the protection substrate 3a. That is, power wiring lines of the cell protection system 3 and the positive electrode and negative electrode of the secondary battery 2 are connected. In this way, it is desirable that the protection substrate 3a has a shape adaptive for the side shape of the secondary battery 2, because the protection substrate 3a is coupled to the side of the secondary battery 2. It is because the cell pack 1 can be compactly manufactured. in an example of FIG. 6, because the cell protection system 3 is mounted on the thin rectangular side of the secondary battery 2, the protection substrate 3a is formed to have the shape adaptive to the side (the thin rectangle in this case).

In the pack cell A in the above-mentioned JP 2007-66748A, a current detection resistance is disposed in a power supply path to carry out over-current detection and cell residual quantity detection. Therefore, the increase of the consumption power due to the detection resistance and the degradation of precision of a measurement voltage are brought. However, in the present embodiment, the current detection resistance is not provided in the power supply path, but is provided in a current path of a small current separate from the power supply path to carry out the over-current detection and the cell residual quantity detection. Therefore, wasteful power consumption due to the detection resistance can be suppressed and the continuous operation time can be elongated. Also, a resistance with a comparatively large resistance value can be selected as the detection resistance. Therefore, it is possible to improve the measurement precision of the measurement voltage. In addition, because a general resistance can be used, the cost reduction becomes possible. Moreover, in the cell protection FET circuit 5, because the drains and the gates are respectively connected in common, all the MOSFETs can be formed to have the same configuration. Therefore, a deviation of the characteristics among the MOSFETs is difficult to occur, so that the stable current mirror characteristic can be obtained and a correct current ratio can be attained. Therefore, the high-precision cell residual quantity detection function can be realized.

Also, in various electronic equipments like a mobile phone, a notebook PC and a smart phone, the request to correctly display the residual quantity of the secondary battery (e.g. Li ion cell) is increasing. Therefore, it is required that the cell pack has an output function of the cell residual quantity. Generally, at the present time, a current which flows through a circuit is detected by using the detection resistance (sense resistance) for over-current detection and a cell residual quantity is calculated by accumulating the detected current in a control circuit, to output it to an external equipment. In the present embodiment, a current path of a low current is provided separate from the power supply path, and a current which flows through a circuit is detected by using the detection resistance (sense resistance) arranged in the current path and the cell residual quantity can be detected by accumulating the detected current in the control circuit. Therefore, the residual quantity can be more correctly measured in the low consumption power.

<First Modification Example>

Comparing the cell pack 1 in this modification example with the cell pack 1 shown in FIG. 1, there is a different that the current detection resistance is included in the control circuit. Below, the difference will be mainly described.

Figure 7:
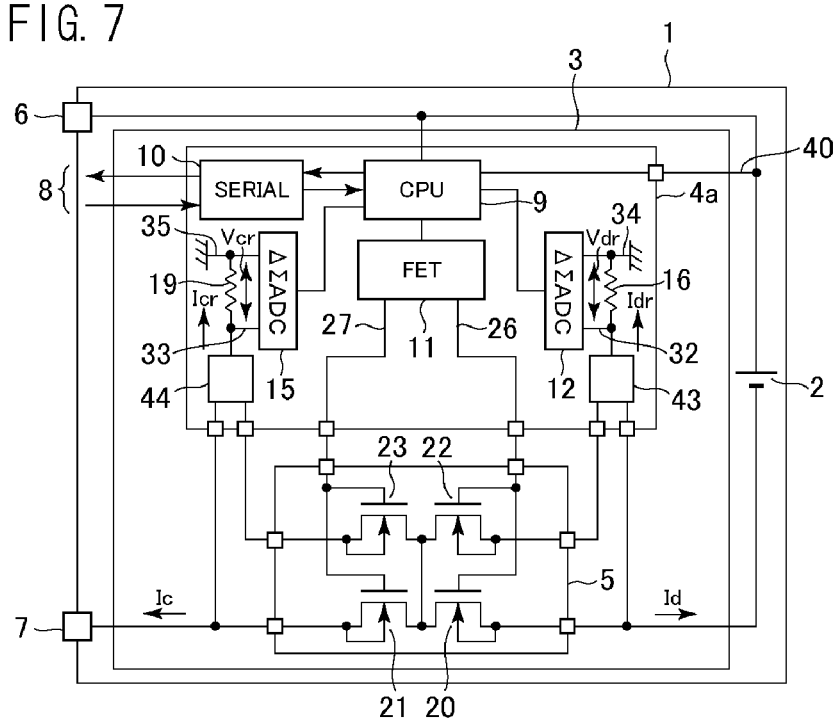
FIG. 7 is a block diagram showing a first modification example of the configuration of the cell pack to which the cell protection system according to the first embodiment is applied.

FIG. 7 is a block diagram showing a first modification example of the configuration of the cell pack to which the cell protection system according to the first embodiment is applied. The cell protection system 3 of this modification example includes a control circuit 4a and a cell protection FET circuit 5. Here, either of the current detection resistances 16 and 19 is not implemented as an individual element. The current detection resistances 16 and 19 are included in the control circuit 4a. If the current detection resistances 16 and 19 are included when the control circuit 4a is provided as a 1-chip semiconductor circuit, the cost for the current detection resistances 16 and 19 can be reduced. In addition, the configuration of the cell protection system 3 can be simplified and the manufacture can be facilitated.

Figure 8:
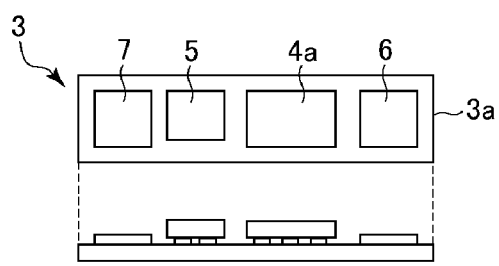
FIG. 8 is a plan view and a side view schematically showing an example of the protection substrate on which the cell protection system of the first modification example is installed.

FIG. 8 is a plan view and a side view schematically showing an example of the protection substrate in which the cell protection system of the first modification example is implemented. In the protection substrate 3a in which the cell protection system 3 of this modification example is implemented, the current detection resistance 16 and 19 are not implemented on the protection substrate 3a as independent elements. That is, the cell protection FET circuit 5 and the control circuit 4a are arranged in this order as the cell protection system 3 between the terminal 6 and the terminal 7 on the thin rectangular protection substrate 3a. Because the number of parts is decreased, the manufacture is facilitated and the cost can be reduced.

In this case, the effect similar to case of the cell pack 1 described with reference to FIG. 1 to FIG. 6 can be obtained.

<Second Modification Example>

Comparing the cell pack 1 of this modification example with the cell pack 1 shown in FIG. 1, in this modification example, there is a difference in that the current detection resistances and the cell protection FET circuit is included in the control circuit. Below, the difference will be mainly described.

Figure 9:
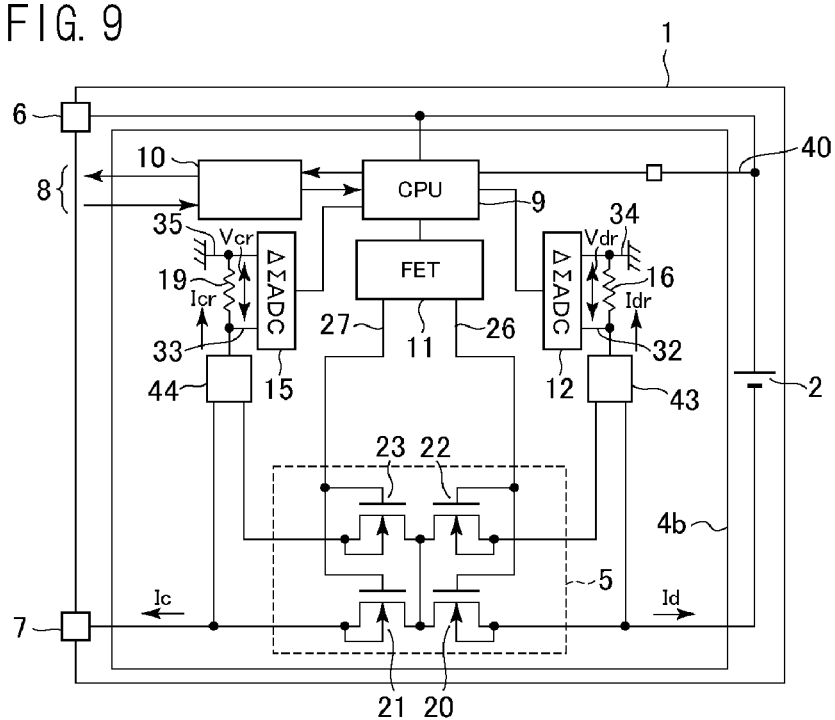
FIG. 9 is a block diagram showing a second modification example of the configuration of the cell pack to which the cell protection system according to the first embodiment is applied.

FIG. 9 is a block diagram showing a second modification example of the configuration of the cell pack to which the cell protection system according to the first embodiment is applied. The cell protection system 3 of this modification example includes a control circuit 4b. Here, either of the current detection resistances 16 and 19 and the cell protection FET circuit 5 is not implemented as an individual element. The current detection resistances 16 and 19 and the cell protection FET circuit 5 are included in the control circuit 4b. When the control circuit 4b is provided as a 1-chip semiconductor circuit to include the current detection resistances 16 and 19 and the cell protection FET circuit 5, the cost for the current detection resistances 16 and 19 and the cell protection FET circuit 5 can be reduced. In addition, the configuration of the cell protection system 3 can be simplified and the manufacture can be facilitated.

Figure 10:
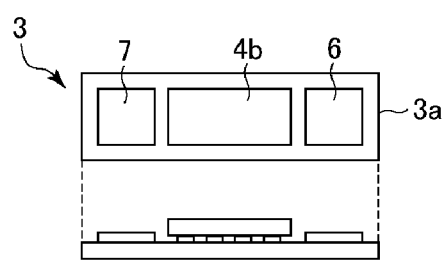
FIG. 10 is a plan view and a side view schematically showing an example of the protection substrate on which the cell protection system of the second modification example is installed.

FIG. 10 is a plan view and a side view schematically showing an example of the protection substrate on which the cell protection system of the second modification example is implemented. In the protection substrate 3a on which the cell protection system 3 of this modification example is implemented, either of the current detection resistances 16 and 19 and the cell protection FET circuit 5 is not implemented as an independent element. That is, the control circuit 4b is arranged in this order as the cell protection system 3 between the terminal 6 and the terminal 7 on the thin rectangular protection substrate 3a. Because the number of parts is decreased, the manufacture is made easy and the cost can be lowered.

In this case, the effect similar to case of the cell pack 1 described with reference to FIG. 1 to FIG. 6 can be obtained.

[Second Embodiment]

The configuration of the cell pack to which the cell protection system according to a second embodiment is applied will be described. In the present embodiment, the configuration of the cell protection FET circuit and its controlling method are different, compared with the first embodiment. Below, the difference will be mainly described.

Figure 11:
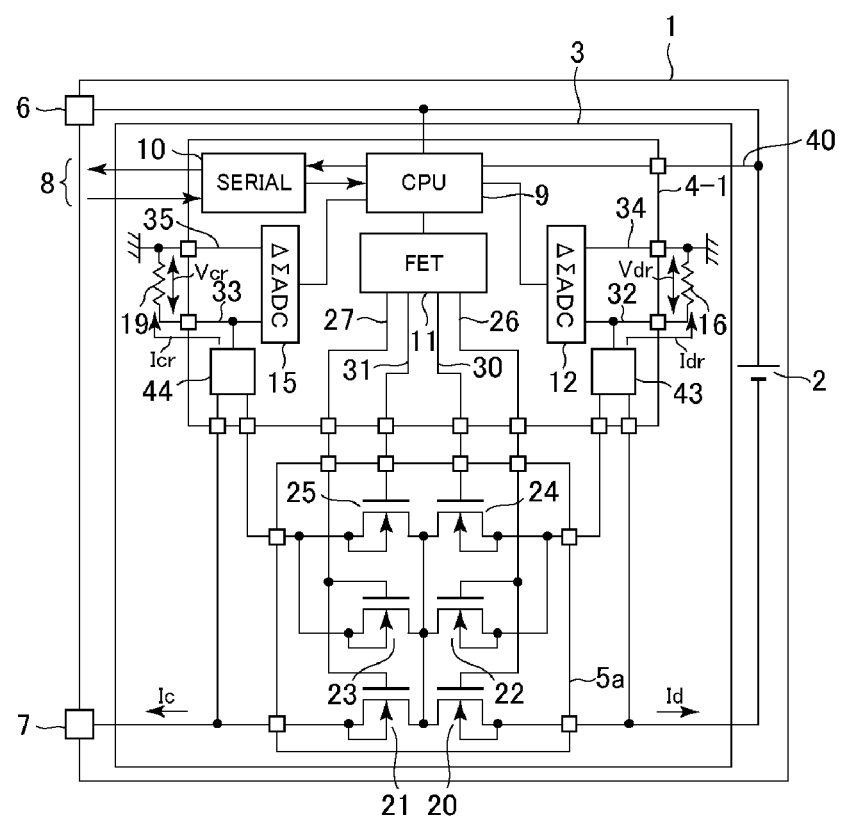
FIG. 11 is a block diagram showing a configuration example of the cell pack to which the cell protection system according to a second embodiment is applied.

FIG. 11 is a block diagram showing a configuration example of the cell pack to which the cell protection system according to a second embodiment is applied. In the cell pack 1, the configuration of a cell protection FET circuit 5a differs from that of the cell protection FET circuit 5 in the first embodiment.

The cell protection FET circuit 5a controls the charging and discharging operations of the secondary battery 2 based on the control of the control circuit 4-1 and protects the secondary battery 2 from an abnormality. The cell protection FET circuit 5a may be provided as a 1-chip semiconductor circuit. The cell protection FET circuit 5 includes the MOSFET 20, the MOSFET 21, the MOSFET 22, the MOSFET 23, the MOSFET 24, and the MOSFET 25.

The MOSFET 20 is a discharge control MOSFET and controls ON/OFF of the power supply path through which the discharge current Id flows in case of the discharging operation. The MOSFET 22 is a discharge current detection MOSFET and outputs the detection current Idr corresponding to the discharge current Id. The MOSFET 24 is a discharge current detection MOSFET and outputs the detection current Idr corresponding to the discharge current Id with the MOSFET 22. Here, the detection current Id>>the detection current Idr by the MOSFET 22 and the MOSFET 22>the discharge current Id by only the MOSFET 22. The drains are connected in common among the MOSFET 20, the MOSFET 22 and the MOSFET 24. The gates are connected in common between the MOSFET 20 and the MOSFET 22. The gates connected in common to the MOSFET 20 and the MOSFET 22 can be connected with an external wiring line through a terminal. The sources are connected in common between the MOSFET 22 and the MOSFET 24. The sources connected in common with the MOSFET 22 and the MOSFET 24 are possible to be connected with an external wiring line through a terminal. The source of the MOSFET 20 is possible to be connected with an external wiring line through a terminal. The gate of the MOSFET 24 is possible to be connected with an external wiring line through a terminal. The source of the MOSFET 20 is connected with the negative electrode of the secondary battery 2. The sources connected in common with the MOSFET 22 and the MOSFET 24 are connected with the current detection resistance 16 through the control circuit 4-1. The gates of the MOSFET 20, the MOSFET 22 and the MOSFET 24 are connected with the FET control section 11. It is supposed that the number of unit cells of the MOSFET 20, the number of unit cells of the MOSFET 24 and the number of unit cells of the MOSFET 22 satisfy a relation of the number of unit cells of the MOSFET 20>>the number of unit cells of the MOSFET 24>the number of unit cells of the MOSFET 22. Regarding the unit cell number ratio, large: middle:small. This is based on the following reason. The discharge current Id flows through the MOSFET 20. On the other hand, the detection current Idr (<<Id) flows through the MOSFET 22 so as to suppress consumption power low. Moreover, when the detection current is too low, the detection current Idr (<<Id, and >the detection current Idr of only the MOSFET 22) flows through the MOSFET 24 according to the situation. Thus, the detection current is increased to keep a high detection precision. In this way, the ratio of the numbers of the unit cells is set as described above, to allow a plurality of detection currents Idr to be disposed in order to appropriately set the current value of the detection current Idr according to the situation. For example, it is supposed that a ratio of the number of unit cells of the MOSFET 20, the number of unit cells of the MOSFET 24 and the number of unit cells of the MOSFET 22 is 20000:199:1. It should be noted that a ratio of gate widths (or channel widths) may be used in place of the unit cell umber ratio.

The MOSFET 21 is a charge control MOSFET and carries out ON/OFF control of the power supply path through which the charge current Ic flows in the charging operation. The MOSFET 23 is a charge current detection MOSFET and outputs the detection current Icr corresponding to the charge current Ic. The MOSFET 25 is a charge current detection MOSFET and outputs the detection current Icr corresponding to the charge current Ic together with the MOSFET 23. Here, the charge current Ic>>the detection current Icr by the MOSFET 23 and the MOSFET 25>the detection current Icr by only the MOSFET 23. The drains are connected in common to the MOSFET 21, the MOSFET 23 and the MOSFET 25. The gates are connected in common to the MOSFET 21 and the MOSFET 23. The gates connected in common with the MOSFET 21 and the MOSFET 23 are possible to be connected with an external wiring line through a terminal. The sources are connected in common to the MOSFET 23 and the MOSFET 25. The sources connected in common with the MOSFET 23 and the MOSFET 25 are possible to be connected with an external wiring line through a terminal. The source of the MOSFET 21 is connected with an external wiring line through a terminal. The gate of the MOSFET 25 is possible to be connected with an external wiring line through a terminal. The source of the MOSFET 21 is connected with the terminal 7. The sources of the MOSFET 23 and the MOSFET 25 are connected with the current detection resistance 19 through the control circuit 4-1. The gates of the MOSFET 21, the MOSFET 23 and the MOSFET 25 are connected with the FET control section 11. It is supposed that the number of unit cells of the MOSFET 21, the number of unit cells of the MOSFET 25 and the number of unit cells of the MOSFET 23 satisfy a relation of: the number of unit cells of the MOSFET 21>>the number of unit cells of the MOSFET 25>the number of unit cells of the MOSFET 23. Regarding the unit cell number ratio, large: middle:small. This is based on the following reason. The charge current Ic flows through the MOSFET 21. On the other hand, the detection current Icr (<<Ic) flows through the MOSFET 23 so as to suppress consumption power low. Moreover, when the detection current is too low, the detection current Icr (<<Ic and >the detection current Icr by only the MOSFET 23) flows through the MOSFET 25 and is larger than the detection current Icr by only the MOSFET 23 according to the situation. Thus, the high detection precision can be kept by increasing the detection current. In this way, the ratio of the numbers of the unit cells is set as described above such that the current value of the detection current Icr is appropriate according to the situation by providing a plurality of current values of the detection current Icr. For example, it is supposed that the ratio of the number of unit cells of the MOSFET 21, the number of unit cells of the MOSFET 25 and the number of unit cells of the MOSFET 23 is 20000:199:1. It should be noted that a ratio of gate widths (or channel widths) may be used in place of the unit cell number ratio.

The current control circuit 43 of the control circuit 4-1 is connected with the power supply path (the source of the MOSFET 20), the sources of the MOSFET 22 and the MOSFET 24 and one end of the current detection resistance 16. The detection current Idr is passed from the MOSFET 22 to the current detection resistance 16 such that the source of the MOSFET 20 and the source of the MOSFET 22 become euqipotential. Or, the detection current Idr is passed from the MOSFET 22 and the MOSFET 24 to the current detection resistance 16 such that the source of the MOSFET 20 and the sources of the MOSFET 22 and the MOSFET 24 become euqipotential. The current control circuit 44 is connected with the power supply path (the source of the MOSFET 21), the sources of the MOSFET 23 and the MOSFET 25 and one end of the current detection resistance 19. The detection current Icr is passed from the MOSFET 23 to the current detection resistance 19 such that the source of the MOSFET 21 and the source of the MOSFET 23 become euqipotential. Or, the detection current Icr is passed from the MOSFET 23 and the MOSFET 25 to the current detection resistance 19 such that the source of the MOSFET 21 and the sources of the MOSFET 23 and the MOSFET 25 become euqipotential.

The FET control section 11 of the control circuit 4-1 is connected with the gates of the MOSFET 20, the MOSFET 22, the MOSFET 24, the MOSFET 21, the MOSFET 23 and the MOSFET 25 of the cell protection FET circuit 5a. The gate voltage of each MOSFET of the cell protection FET circuit 5a is controlled based on the control of the CPU 9 to turn on/off each MOSFET.

The one end of the current detection resistance 16 is connected with the sources of the MOSFET 22 and the MOSFET 24 of the cell protection FET circuit 5a through the current control circuit 43 and the other end is connected with the GND. Moreover, the one end and the other end of the current detection resistance 16 are connected with the ADC 12. The current detection resistance 16 is a discharge current detection resistance, and is provided to correspond to the MOSFET 22 and the MOSFET 24 for the discharge current detection. The one end of the current detection resistance 19 is connected with the sources of the MOSFET 23 and the MOSFET 25 of the cell protection FET circuit 5a through the current control circuit 44, and the other end is connected with the GND. Moreover, the one end and the other end of the current detection resistance 19 are connected with the ADC 15. The current detection resistance 19 is a charge current detection resistance, and is provided to correspond to the MOSFET 23 and the MOSFET 25 for the charge current detection. The current detection resistances 16 and 19 may be provided as independent elements.

The other configuration is same as that of the first embodiment and the explanation is omitted.

Figure 12:
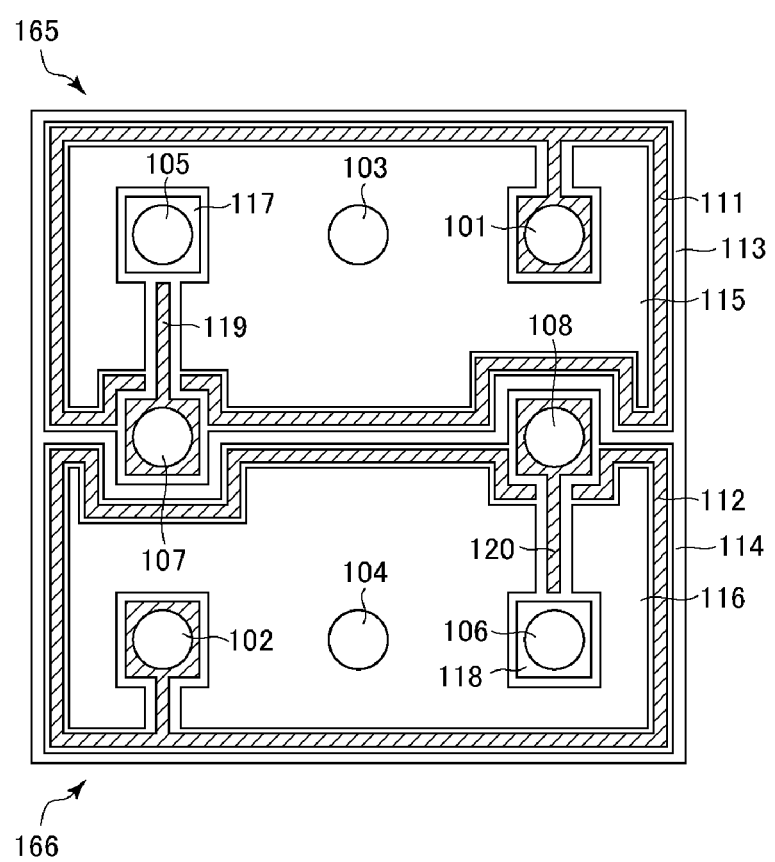
FIG. 12 is a plan view showing a configuration example of the cell protection FET circuit 5 shown in FIG. 11.

FIG. 12 is a plan view showing a configuration example of the cell protection FET circuit 5a shown in FIG. 11. For example, here, the area 165 corresponds to the charge control MOSFET 21, and the charge current detection MOSFETs 23 and 25. The area 166 corresponds to the discharge control MOSFET 20, and the discharge current detection MOSFETs 22 and 24. Because the area 165 and the area 166 have the same configuration and is the point symmetry with respect to the center of the drawing, the area 165 will be mainly described below.

The area 165 is surrounded with an equipotential ring 113. The present embodiment is different from the first embodiment in that the MOSFET 25 having a different gate is added to the area 165 and the MOSFETs 21, 23 and 25 are provided. A plurality of MOSFETs in the area surrounded with the gate wiring line 111 configure the charge control MOSFET 21, and the charge current detection MOSFETs 23 and 25. For example, it is supposed that an MOSFET in a predetermined area of the area surrounded with the gate wiring line 111 is set as the MOSFET 23, and an MOSFET in an area wider than the MOSFET 23, of the area surrounded with the gate wiring line 111 is set as the MOSFET 25. It is supposed that an MOSFET in the remainder of the area surrounded with the gate wiring line 111 is set as the MOSFET 21. The section of each unit cell of the MOSFETs 21 and 23 is the same as the section of each unit cell of the MOSFETs 21 and 23 shown in FIG. 3. The section of the unit cell of the MOSFET 25 is the same as the section of the unit cell of the MOSFET 23 shown in FIG. 3. At this time, the ratio of the area of the MOSFET 23 (equivalent to the number of unit cells), the area of the MOSFET 25 (equivalent to the number of unit cells) and the area of the MOSFET 21 (equivalent to the number of unit cells) may be 1:199:20000.

The sources of the MOSFET 23 and the MOSFET 25 are connected with a source electrode 117 through a contact. A source electrode 117 is connected with a source terminal 105. On the other hand, the source of the MOSFET 21 is connected with the source electrode 115 through a contact. The source electrode 115 is connected with a source terminal 103. The gate of the MOSFET 23 and the gate of the MOSFET 21 are connected with the gate wiring line 111 through a contact. The gate wiring line 111 is connected with a gate terminal 101. The gate of the MOSFET 25 is connected with a gate wiring line 119 through a contact. The gate wiring line 119 is connected with a gate terminal 107. It should be noted that the drain electrode is common to the MOSFETs 21, 23 and 25 and is provided on the back side of the semiconductor chip.

It should be noted that the area 166 is surrounded with the euqipotential ring 114. The gate wiring line 112 which is common to the discharge control MOSFET 20 and the discharge current detection MOSFET 22, the gate terminal 102, the gate wiring line 120 of the discharge current detection MOSFET 24 and the gate terminal 108 are provided for the area 166. Moreover, a source electrode 118 of the MOSFET 22 and the MOSFET 24, a source terminal 106, a source electrode 116 of the MOSFET 20 and a source terminal 104 are provided. It should be noted that a drain electrode is common to the MOSFETs 20, 22, and 24, and the MOSFETs 21, 23, and 25 and is provided on back side of the semiconductor chip.

FIG. 12 shows a semiconductor chip of the CSP type that eight terminals are arranged in a square in a constant interval. By arranging the gate terminals of the MOSFET 24 and the MOSFET 25 at the gate in the boundary between the area 165 and the area 166, because the eight terminals are arranged along four sides of the semiconductor chip, it becomes easy to design a layout of wiring lines on the side of the protection substrate 3a which correspond to each terminal.

In the present embodiment, because the CSP-type configuration is adopted like the first embodiment, the turn-on resistance of the MOSFET can be suppressed low. Also, because it is not necessary to dispose the drain electrode of each MOSFET on the surface side, a problem does not occur that an effective cell area cannot be made large and that the chip size becomes large.

Next, the operation of the cell pack to which the cell protection system according to the present embodiment is applied will be described.

First, the discharging operation of the cell pack will be described. A load (not shown) is connected between the terminal 6 and the terminal 7. The CPU 9 instructs the FET control section 11 to connect a discharge path. The FET control section 11 outputs the gate control signal 26 in the H level and the gate control signal 27 to the cell protection FET circuit 5. The MOSFET 20 and the MOSFET 22 are turned on in response to the gate control signal 26 in the H level. Moreover, the MOSFET 21 and the MOSFET 23 are turned on in response to the gate control signal 27 in the H level. Thus, the discharge path between the secondary battery 2 and the terminal 7 is connected and the discharge current Id flows in the direction of the arrow of FIG. 11. That is, the secondary battery 2 operates the discharging operation. At this time, the FET control section 11 outputs the gate control signals 30 and 31 in the L level to the cell protection FET circuit 5. Therefore, the MOSFET 24 and the MOSFET 25 are turned off together.

At this time, the current control circuit 43 operates such that the source voltage of the MOSFET 20 and the source voltage of the MOSFET 22 become euqipotential. Because the drains and the gates are respectively connected in common, the MOSFET 20 and the MOSFET 22 operate as a current mirror circuit. Here, it is supposed that a ratio of the number of unit cells of the MOSFET 20 and the number of unit cells of the MOSFET 22 is 20000:1. In this case, the detection current Idr of 1/20000 of the discharge current Id which flows through the MOSFET 20 flows through the current detection resistance R16 via the MOSFET 22 and the current control circuit 43. The ADC 12 reads (analog signal) the voltage Vdr across the both ends of the current detection resistance R16, and converts the read result into a digital signal to output to the CPU 9. The CPU 9 calculates the discharge current Id (Id=Vdr/R16×20000) and calculates the used electric quantity by accumulating the discharge current Id. Then, the CPU 9 calculates the residual quantity of the secondary battery 2 by subtracting the used electric quantity from the electric quantity (stored in the CPU 9 or in the external storage section) stored in the charging operation. The CPU 9 outputs the calculated residual quantity of the secondary battery 2 to an external equipment through the serial IF 10.

The detection current Idr which flows through the MOSFET 22 becomes very small when the discharge current Id is reduced for the discharge or in a low consumption current mode, like a standby state. Therefore, there is a fear that the measurement precision is lowered. Thus, the CPU 9 instructs the FET control section 11 to add a path of the detection current when the discharge current Id reduces below a predetermined value (stored in the CPU 9 or the external storage section). The FET control section 11 outputs the gate control signal 30 in the H level to the cell protection FET circuit 5a. The MOSFET 24 is turned on in response to the gate control signal 30 in the H level. Here, it is supposed that the gate control signal 26 and the gate control signal 30 have the same potential. Thus, because the drains and the gates are respectively connected in common to the MOSFET 20, the MOSFET 22 and the MOSFET 24, these MOSFETs operate as a current mirror circuit. Here, it is supposed that the ratio of the number of unit cells of the MOSFET 20, the number of unit cells of the MOSFET 22 and the number of unit cells of the MOSFET 24 is 20000:1:199. In this case, the detection current Idr of 200/20000 (=1/20000+199/20000) of the discharge current Id which flows through the MOSFET 20 flows through the current detection resistance R16 via the current control circuit 43. The ADC 12 reads (analog signal) the voltage Vdr across the both ends of the current detection resistance R16, and converts the read result into a digital signal to output to the CPU 9. The CPU 9 calculates the discharge current Id (Id=Vdr/R16×20000/200) and calculates the electric quantity used by accumulating the discharge current Id. Then, the CPU 9 calculates the residual quantity of the secondary battery 2 by subtracting the used electric quantity from the electric quantity (stored in the CPU 9 or the external storage section) stored in the charging operation. The CPU 9 outputs the calculated residual quantity of the secondary battery 2 to the external equipment through the serial IF 10.

In this way, in the present embodiment, in addition to the discharge current detection MOSFET 22, the discharge current detection MOSFET 24 is provided in parallel with the MOSFET 22. The number of unit cells of the MOSFET 24 and the number of unit cells of the MOSFET 22 are set to different values. As a result, in case where the discharge current Id should be detected, when the discharge current Id is large, the discharge current Id is measures by using only the detection current Idr from the MOSFET 22, and when the discharge current Id is small, the discharge current Id is measured by using the detection currents Idr from both of the MOSFET 22 and the MOSFET 24. That is, by changing a detection current ratio (Idr/Id) according to the discharge current Id, the detection range to detect the discharge current Id can be selected. As a result, the detection of the high precision can be carried out regardless of the magnitude of the discharge current Id.

Also, the operation of the over-current and the residual quantity lack is same as that of the first embodiment, and the explanation is omitted.

Next, the charging operation of the cell pack will be described. The positive electrode of a charging device (not shown) is connected with the terminal 6 on the side of the positive electrode of the secondary battery 2 and the negative electrode of the charging device is connected with the terminal 7 on the side of the negative electrode of the secondary battery 2. The CPU 9 instructs the FET control section 11 to connect the charge path. The FET control section 11 outputs the gate control signal 26 and gate control signal 27 in the H level to the cell protection FET circuit 5. The MOSFET 20 and the MOSFET 22 are turned on in response to the gate control signal 26 in the H level. Moreover, the MOSFET 21 and the MOSFET 23 are turned on in response to the gate control signal 27 in the H level. Thus, the charge path between the secondary battery 2 and the terminal 7 is connected and the charge current Ic flows in the direction of the arrow of FIG. 11. That is, the secondary battery 2 performs the charging operation. At this time, the FET control section 11 outputs the gate control signals 30 and 31 in the L level to the cell protection FET circuit 5a. Therefore, the MOSFET 24 and the MOSFET 25 are turned off together.

At this time, the current control circuit 44 operates such that the source voltage of the MOSFET 21 and the source voltage of the MOSFET 23 become euqipotential. Because the drains and the gates are respectively connected in common, the MOSFET 21 and the MOSFET 23 operate as the current mirror circuit. Here, it is supposed that a ratio of the number of unit cells of the MOSFET 21 and the number of unit cells of the MOSFET 23 is 20000:1. In this case, the detection current Icr of 1/20000 of the charge current Ic which flows through the MOSFET 21 flows through the current detection resistance R19 via the MOSFET 23 and the current control circuit 44. The ADC 15 reads (analog signal) the voltage Vcr across the both ends of the current detection resistance R19, and converts the read result into the digital signal to output to the CPU 9. The CPU 9 calculates the charge current Ic (Ic=Vcr/R19×20000) and calculates the electric quantity stored in the secondary battery 2 by accumulating the charge current Ic. Then, the CPU 9 outputs the stored electric quantity to the external equipment through the serial IF 10.

When approaching the full charge state so that the charge current Ic decreases, the detection current Icr which flows through the MOSFET 23 becomes very small. Therefore, there is a fear that the measurement precision is degraded. Therefore, the CPU 9 instructs the FET control section 11 to add a path of the detection current when the charge current Ic becomes less than a predetermined value (stored in the CPU 9 or the external storage section). The FET control section 11 outputs the gate control signal 31 in the H level to the cell protection FET circuit 5a. The MOSFET 25 is turned on in response to the gate control signal 31 in the H level. Here, it is supposed that the gate control signal 27 and the gate control signal 31 have the same potential. Thus, because the drains and the gates are connected in common, the MOSFET 21, the MOSFET 23 and the MOSFET 25 operate as the current mirror circuit. Here, it is supposed that the ratio of the number of unit cells of the MOSFET 21, the number of unit cells of the MOSFET 23 and the number of unit cells of the MOSFET 25 is 20000:1:199. In this case, the detection current Icr of 200/20000 (=1/20000+199/20000) of the charge current Ic which flows through the MOSFET 21 flows through the current detection resistance R19 via the current control circuit 44. The ADC 15 reads (analog signal) the voltage Vcr across the both ends of the current detection resistance R19, and converts the read result into the digital signal to output to the CPU 9. The CPU 9 calculates the charge current Ic (Ic=Vcr/R19×20000/200) and calculates the electric quantity stored in the secondary battery by accumulating the charge current Ic. Then, the CPU 9 calculates the residual quantity of the secondary battery 2 by adding the stored electric quantity to the electric quantity (stored in the CPU 9 or the external storage section) left in case of the discharging operation. The CPU 9 outputs the calculated residual quantity of the secondary battery 2 to the external equipment through the serial IF 10.

In this way, in the present embodiment, in addition to the charge current detection MOSFET 23, the charge current detection MOSFET 25 is provided in parallel with the MOSFET 23. The number of unit cells of the MOSFET 25 and the number of unit cells of the MOSFET 23 are set to different values. As a result, in case where the charge current Ic should be detected, when the charge current Ic is large, the charge current Ic is measured by using the detection current Icr from only the MOSFET 23, and when the charge current Ic is small, the charge current Ic is measured by using the detection current Icr from both of the MOSFET 23 and the MOSFET 25. That is, by changing (two in this case) the detection current ratio (Icr/Ic) according to the magnitude of the charge current Ic, the detection range to detect the charge current Ic can be selected. As a result, the detection of the high precision can be carried out regardless of the magnitude of the charge current Ic.

Also, the operation of the over-current and the full charge is same as the first embodiment, and the explanation is omitted.

As mentioned above, the cell pack to which the cell protection system according to the present embodiment is applied operates.

It should be noted that in the present embodiment, the one MOSFET 24 is added for the discharge current detection. However, many MOSFETs may be added. For example, when a MOSFET 26 for the discharge current detection is further added, the MOSFET 26 is configured in the following configuration. The MOSFET 26 differs from the MOSFETs 22 and 24 in the unit cell ratio, the drains and the sources are respectively connected in common to the MOSFETs 22 and 24 and the gate is connected with the FET control section 11. In this case, by the MOSFETs 22, 24, and 26, can be either of combinations of only the MOSFET 22, the MOSFET 22+the MOSFET 24, the MOSFET 22+the MOSFET 26, and the MOSFET 22+the MOSFET 24+the MOSFET 26. Thus, the range (the range) of the measurement to measure a current can be increased and the high precision measurement (detection) can be carried out.

In the same way, one MOSFET 25 is added as the charge current detection in the present embodiment. However, many MOSFETs may be added. For example, when a charge current detection MOSFET 27 is further added, the MOSFET 27 is configured in the following configuration. The MOSFET 27 differs from the MOSFETs 23 and 25 in the unit cell ratio, has a drain and a source which are common with the MOSFETs 23 and 25, and the gate connected with the FET control section 11. In this case, by using the MOSFETs 23, 25, and 27, either of combinations of only the MOSFET 23, the MOSFET 23+the MOSFET 25, the MOSFET 23+the MOSFET 27, the MOSFET 23+the MOSFET 25+the MOSFET 27 is used. Moreover, the range (the range) of the measurement to measure the current can be increased and moreover, the measurement (detection) of the high precision can be carried out.

Because an example of the current control circuit 43 and the current control circuit 44 is same (FIG. 4) as the first embodiment, the explanation is omitted. Also, because an example of the protection substrate on which the cell protection system is implemented and an example of the cell pack in which the cell protection system is implemented are same (FIG. 5, FIG. 6) as those of the first embodiment, the explanation is omitted.

The effect like the first embodiment can be attained in the present embodiment.

Moreover, in the present embodiment, the detection current ratio can be changed according to the magnitude of the current to be detected (measured). For example, when the discharge current Id and the charge current Ic are large, the detection current ratio of 1/20000 may be set. When the discharge current Id and the charge current Ic are small, the detection current ratio of 1/100 may be used. Thus, the discharge current Id and the charge current Ic can be correctly detected in the wide detection range. Also, shown in FIG. 11, the circuit is configured from the control MOSFETs of one set and the current detection MOSFETs of two sets. However, the current detection MOSFETs may be set more than two. In this case, it is possible to detect a current in the wider range.

<First Modification Example>

Comparing the cell pack 1 of this modification example with the cell pack 1 of FIG. 11, there is a difference in that the current detection resistance is included in the control circuit. Below, the difference will be mainly described.

Figure 13:
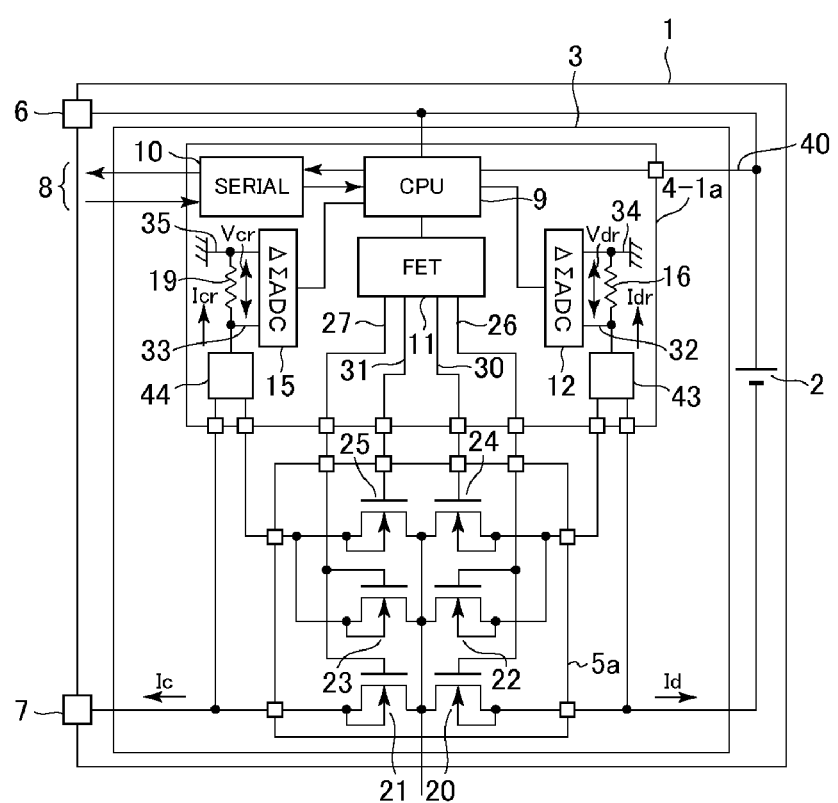
FIG. 13 is a block diagram showing the first modification example of the configuration of the cell pack to which the cell protection system according to the second embodiment is applied.

FIG. 13 is a block diagram showing a first modification example of the configuration of the cell pack to which the cell protection system according to the second embodiment is applied. The cell protection system 3 of this modification example includes a control circuit 4-1a and the cell protection FET circuit 5a. Here, any of the current detection resistances 16 and 19 is not implemented as an independent element. The current detection resistances 16 and 19 are included in the control circuit 4-1a. When the control circuit 4-1a is provided as a 1-chip semiconductor circuit, the cost of the current detection resistances 16 and 19 can be reduced by including the current detection resistances 16 and 19. In addition, the configuration of the cell protection system 3 can be simplified and the manufacture can be facilitated. It should be noted that an example of the protection substrate 3a in which the cell protection system 3 is implemented, is basically the same as an example (FIG. 8) of the protection substrate 3a on which the cell protection system 3 of the first modification example according to the first embodiment is implemented (here, the control circuit 4-1a and the cell protection FET circuit 5a are used instead of the control circuit 4a and the cell protection FET circuit 5). Therefore, the explanation is omitted.

In this case, the effect similar to case of the cell pack 1 described in FIG. 11 and FIG. 12 can be attained.

<Second Modification Example>

Comparing the cell pack 1 of this modification example with the cell pack 1 of FIG. 11, there is a difference in that the current detection resistance and the cell protection FET circuit are included in the control circuit. Below, the difference will be mainly described.

Figure 14:
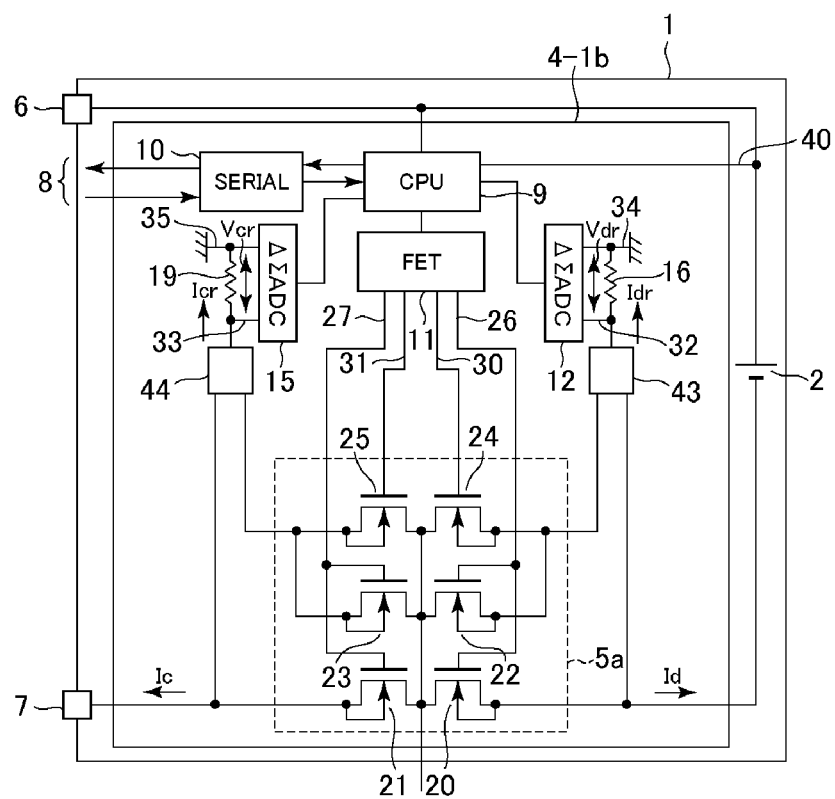
FIG. 14 is a block diagram showing the second modification example of the configuration of the cell pack to which the cell protection system according to the second embodiment is applied.

FIG. 14 is a block diagram showing the second modification example of the configuration of the cell pack to which the cell protection system according to the second embodiment is applied. The cell protection system 3 of this modification example includes the control circuit 4-1b. Here, the current detection resistances 16 and 19 and the cell protection FET circuit 5a are implemented as independent elements. The current detection resistances 16 and 19 and the cell protection FET circuit 5a are included in the control circuit 4-1b. When the control circuit 4-1b is provided as a 1-chip semiconductor circuit, the cost of the current detection resistances 16 and 19 and the cell protection FET circuit 5a can be reduced by including the current detection resistances 16 and 19 and the cell protection FET circuit 5a. In addition, the configuration of the cell protection system 3 can be simplified and the manufacture can be facilitated. It should be noted that an example of the protection substrate 3a on which the cell protection system 3 is implemented is basically the same as an example (FIG. 10) of the protection substrate 3a on which the cell protection system 3 of the second modification example according to the first embodiment is implemented (here, the control circuit 4-1b and the cell protection FET circuit 5a are used instead of the control circuit 4b and the cell protection FET circuit 5). Therefore, the explanation is omitted.

In this case, the effect similar to the case of the cell pack 1 shown in FIG. 11 and FIG. 12 can be attained.

[Third Embodiment]

The configuration of the cell pack to which the cell protection system according to a third embodiment is applied will be described. In the present embodiment, the configuration of the cell protection FET circuit and a controlling method are different from the first embodiment. Below, the difference will be mainly described.

Figure 15:
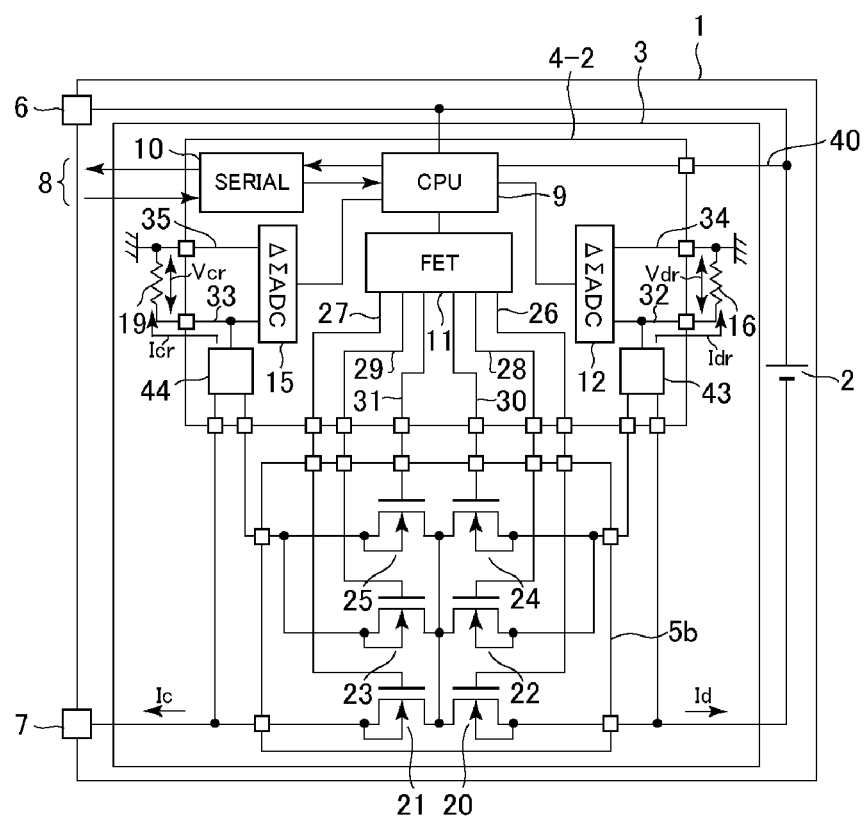
FIG. 15 is a block diagram showing a configuration example of the cell pack to which the cell protection system according to a third embodiment is applied.

FIG. 15 is a block diagram showing a configuration example of the cell pack to which the cell protection system according to a third embodiment is applied. In the cell pack 1, the configuration of a cell protection FET circuit 5b differs from the cell protection FET circuit 5 in the first embodiment.

The cell protection FET circuit 5b controls the charging and discharging operations of the secondary battery 2 based on the control of a control circuit 4-2 and protects the secondary battery 2 from an abnormality. A cell protection FET circuit 5c may be provided as a 1-chip semiconductor circuit. The cell protection FET circuit 5b has the MOSFET 20, the MOSFET 21, the MOSFET 22, the MOSFET 23, the MOSFET 24, and the MOSFET 25.

The MOSFET 20 is a discharge control MOSFET and carries out ON/OFF control of the power supply path through which the discharge current Id flows in case of the discharging operation. The MOSFET 22 is a discharge current detection MOSFET and outputs the detection current Idr corresponding to the discharge current Id. The MOSFET 24 is a discharge current detection MOSFET and again outputs the detection current Idr corresponding to the discharge current Id independently from the MOSFET 22. Here, the following relation is satisfied: the discharge current Id>>the detection current Idr by the MOSFET 24 and the MOSFET 22>the detection current Idr by only the MOSFET 24>the detection current Idr only by the MOSFET 22. The drains are connected in common between the MOSFET 20, the MOSFET 22 and the MOSFET 24. The sources are connected in common between the MOSFET 22 and the MOSFET 24. The sources connected in common between the MOSFET 22 and the MOSFET 24 are possible to be connected with an external wiring line through a terminal. The source of the MOSFET 20 is possible to be connected with an external wiring line through a terminal. The gates of the MOSFETs 20, 22 and 24 are possible to be connected with external wiring lines through terminals. The source of the MOSFET 20 is connected with the negative electrode of the secondary battery 2. The sources of the MOSFET 22 and the MOSFET 24 are connected with the current detection resistance 16 through the control circuit 4-2. The gates of the MOSFET 20, the MOSFET 22 and the MOSFET 24 are connected with the FET control section 11. It is supposed that the number of unit cells of the MOSFET 20, the number of unit cells of the MOSFET 24 and the number of unit cells of the MOSFET 22, the number of unit cells of the MOSFET 20>>the number of unit cells of the MOSFET 24>the number of unit cells of the MOSFET 22. Regarding the unit cell number ratio, large:middle:small. The reason is same as in the second embodiment. For example, it is supposed that the ratio of the number of unit cells of the MOSFET 20, the number of unit cells of the MOSFET 24 and the number of unit cells of the MOSFET 22 is 20000:200:100. It should be noted that a ratio of gate widths (or channel widths) may be used in place of the unit cell number ratio.

The MOSFET 21 is a charge control MOSFET and carries out ON/OFF control of the power supply path through which the charge current Ic flows in the charging operation. The MOSFET 23 is a charge current detection MOSFET and outputs the detection current Icr corresponding to the charge current Ic. The MOSFET 25 is a charge current detection MOSFET for the and again outputs the detection current Icr corresponding to the charge current Ic independently from the MOSFET 23. Here, the charge current Ic>>the detection current Icr by the MOSFET 23 and the MOSFET 25>the detection current Icr only by the MOSFET 25>the detection current Icr only by the MOSFET 23. The drains are connected in common between the MOSFET 21, the MOSFET 23 and the MOSFET 25. The sources are connected in common between the MOSFET 23 and the MOSFET 25. The sources connected in common between the MOSFET 23 and the MOSFET 25 are possible to be connected with an external wiring line through a terminal. The source of the MOSFET 21 is possible to be connected with an external wiring line through a terminal. The gates of the MOSFET 21, 23, and 25 are possible to be connected with external wiring lines through terminals. The source of the MOSFET 21 is connected with the terminal 7. The sources of the MOSFET 23 and the MOSFET 25 are connected with the current detection resistance 19 through the control circuit 4-2. The gates of the MOSFET 21, the MOSFET 23 and the MOSFET 25 are connected with the FET control section 11. It is supposed that the number of unit cells of the MOSFET 21, the number of unit cells of the MOSFET 25 and the number of unit cells of the MOSFET 23 satisfy the following relation: the number of unit cells of the MOSFET 21>>the number of unit cells of the MOSFET 25>the number of unit cells of the MOSFET 23. Regarding the unit cell number ratio, large:middle:small. Its reason is same as in the second embodiment. For example, it is supposed that the ratio of the number of unit cells of the MOSFET 21, the number of unit cells of the MOSFET 25 and the number of unit cells of the MOSFET 23 is 20000:200:100. It should be noted that a ratio of gate widths (or channel widths) may be used in place of the unit cell number ratio.

The current control circuit 43 of the control circuit 4-2 is connected with the power supply path (the source of the MOSFET 20), the sources of the MOSFET 22 and the MOSFET 24 and one end of the current detection resistance 16. The detection current Idr is passed from the MOSFET 22 and/or the MOSFET 24 to the current detection resistance 16 such that the source of the MOSFET 20 and the source of the MOSFET 22 and/or the MOSFET 24 become euqipotential. The current control circuit 44 is connected with the power supply path (the source of the MOSFET 21), the source of the MOSFET 23 and the MOSFET 25 and one end of the current detection resistance 19. The detection current Icr is passed from the MOSFET 23 and/or the MOSFET 25 to the current detection resistance 19 such that the source of the MOSFET 21 and the source of the MOSFET 23 and/or the MOSFET 25 become euqipotential.

The FET control section 11 of the control circuit 4-2 is connected with the gates of the MOSFET 20, the MOSFET 22, the MOSFET 24, the MOSFET 21, the MOSFET 23 and the MOSFET 25 of the cell protection FET circuit 5b. The FET control section 11 controls the gate voltage of each MOSFET of the cell protection FET circuit 5b based on the control of the CPU 9, to carry out ON/OFF control of the each MOSFET.

The one end of the current detection resistance 16 is connected with the sources of the MOSFET 22 and the MOSFET 24 of the cell protection FET circuit 5b through the current control circuit 43 and the other end thereof is connected with the GND. Moreover, the one end and the other end of the current detection resistance 16 are connected with the ADC 12. The current detection resistance 16 is a resistance for the discharge current detection, and is provided to correspond to the MOSFET 22 and the MOSFET 24 for the discharge current detection. The one end of the current detection resistance 19 is connected with the source of the MOSFET 23 and the MOSFET 25 of the cell protection FET circuit 5*b* through the current control circuit 44 and the other end is connected with the GND. Moreover, the one end and the other end of the current detection resistance 19 are connected with the ADC 15. The current detection resistance 19 is a resistance for the charge current detection, and is provided to correspond to the MOSFET 23 and the MOSFET 25 for the charge current detection. The current detection resistances 16 and 19 may be provided as independent elements.

The other configuration is same as that of the first embodiment, the explanation is omitted.

Figure 16:
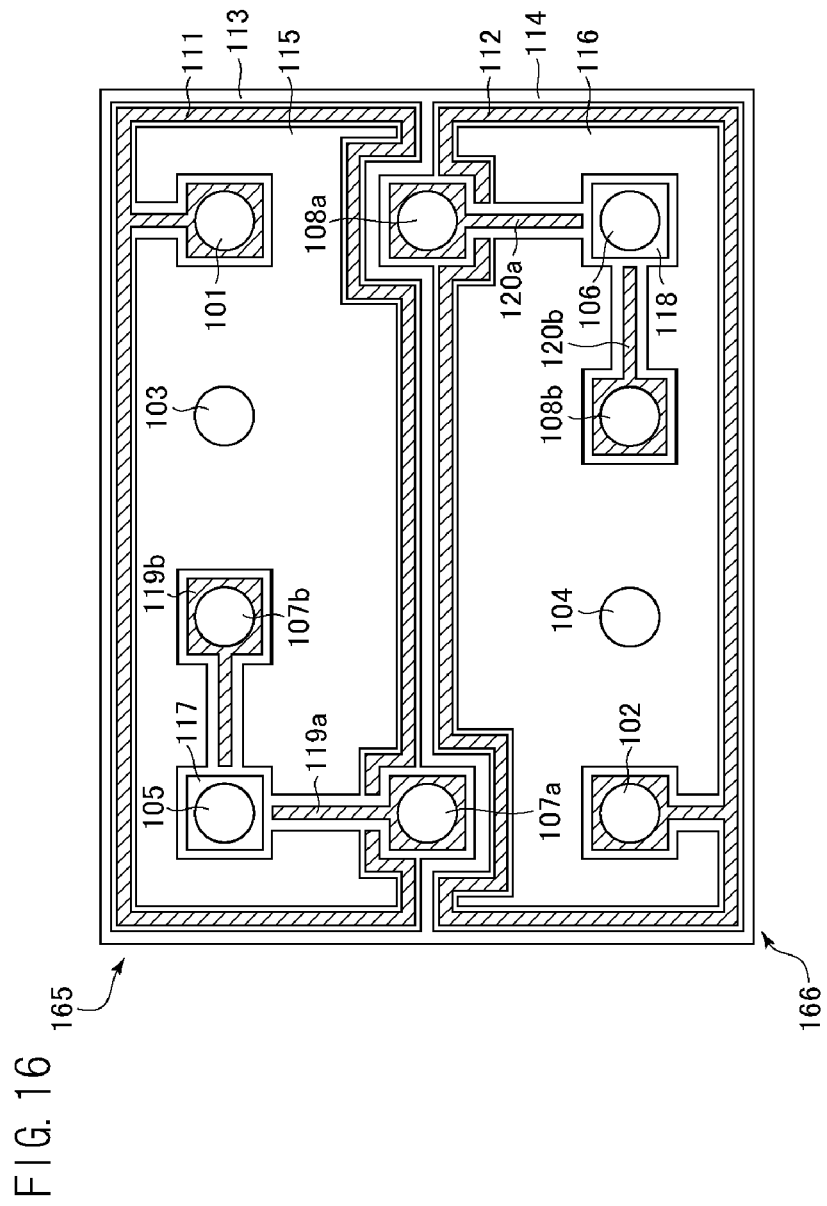
FIG. 16 is a plan showing a configuration example of the cell protection FET circuit 5 shown in FIG. 15.

FIG. 16 is a plan view showing a configuration example of the cell protection FET circuit 5*b* shown in FIG. 15. For example, here, the area 165 corresponds to the charge control MOSFET 21, and the charge current detection MOSFETs 23 and 25. The area 166 corresponds to the discharge control MOSFET 20, and the discharge current detection MOSFETs 22 and 24. The area 165 and the area 166 have the same configuration that is the point symmetry with respect to the center of the drawing. Thus, the area 165 will be mainly described below.

The area 165 is surrounded with the euqipotential ring 113. In the present embodiment, the MOSFET 25 having a different gate is added to the area 165 than the first embodiment, and the gate of the MOSFET 23 is separated from the gate of the MOSFET 21, and the MOSFETs 21, 23 and 25 are provided. The plurality of MOSFETs in the area surrounded with the gate wiring line 111 configure the charge control MOSFET 21, and the charge current detection MOSFETs 23 and 25. For example, it is supposed that an MOSFET in a predetermined area of the area surrounded with the gate wiring line 111 is the MOSFET 23 and it is supposed that an MOSFET in a predetermined area which is wider than the MOSFET 23 is the MOSFET 25 in the area surrounded with the gate wiring line 111. Then, it is supposed that an MOSFET in the remaining portion of the area surrounded with the gate wiring line 111 is the MOSFET 21. The section of each unit cell of the MOSFET 21 and 23 unit cells is the same as the section of each unit cell of the MOSFET 21 and 23 shown in FIG. 3. The section of the unit cell of the MOSFET 25 is the same as the section of the unit cell of the MOSFET 23 shown in FIG. 3. For example, at this time, the ratio of the area of the MOSFET 23 (equivalent to the number of unit cells), the area of the MOSFET 25 (equivalent to the number of unit cells) and the area of the MOSFET 21 (equivalent to the number of unit cells) may be set to be 100:200:20000.

The sources of the MOSFET 23 and the MOSFET 25 are connected with the source electrode 117 through a contact. The source electrode 117 is connected with the source terminal 105. On the other hand, the source of the MOSFET 21 is connected with the source electrode 115 through a contact. The source electrode 115 is connected with the source terminal 103. The gate of the MOSFET 21 is connected with the gate wiring line 111 through a contact. The gate wiring line 111 is connected with the gate terminal 101. The gate of the MOSFET 23 is connected with the gate wiring line 119*a* through a contact. The gate wiring line 119*a* is connected with the gate terminal 107*a*. The gate of the MOSFET 25 is connected with the gate wiring line 119*b* through a contact. The gate wiring line 119*b* is connected with the gate terminal 107*b*. It should be noted that the drain electrode is common to the MOSFETs 21, 23 and 25 and is provided on the back side of the semiconductor chip.

It should be noted that the area 166 is surrounded with the euqipotential ring 114. The gate wiring line 112 of the discharge control MOSFET 20, the gate terminal 102, and the gate wiring line 120*a* of the discharge current detection MOSFET 22, the gate terminal 108*a*, the gate wiring line 120*b* of the discharge current detection MOSFET 24 and the gate terminal 108*b* are provided in the area 166. Moreover, the source electrode 118 of the MOSFET 22 and the MOSFET 24, the source terminal 106, the source electrode 116 of the MOSFET 20 and the source terminal 104 are provided. It should be noted that the drain electrode is common to the MOSFETs 20, 22 and 24, and the MOSFET 21, 23 and 25 and is provided on the back side of the semiconductor chip.

In the present embodiment, because the CSP-type configuration is adopted like the first embodiment, the turn-on resistance of the MOSFET can be suppressed low. Also, because it is not necessary to provide the drain electrode of each MOSFET on the surface, the problem does not occur that an effective cell area cannot be increased and the chip size becomes large.

Also, in the present embodiment, the CSP-type semiconductor chip is adopted in which 10 terminals are arranged in a square in constant intervals. The difference from the terminal arrangement shown in FIG. 12 is in that two lines each having 4 terminals because two gate terminals are increased. Because the 10 terminals are arranged along four sides of the semiconductor chip even in case of this arrangement, a layout of wiring lines on the side of the protection substrate 3*a* for each terminal becomes easy.

Next, the operation of the cell pack to which the cell protection system according to the present embodiment is applied will be described.

First, the discharging operation of the cell pack will be described. A load (not shown) is connected between the terminal 6 and the terminal 7. The CPU 9 instructs the FET control section 11 to connect a discharge path. The FET control section 11 outputs the gate control signal 26 and the gate control signal 27 in the H level to the cell protection FET circuit 5*b*. The MOSFET 20 is turned on in response to the gate control signal 26 in the H level. Moreover, the MOSFET 21 is turned on in response to the gate control signal 27 in the H level. Thus, the discharge path between the secondary battery 2 and the terminal 7 is connected and the discharge current Id flows in the direction of the arrow of FIG. 15. That is, the secondary battery 2 performs a discharging operation. Also, the FET control section 11 outputs the gate control signal 28 and gate control signal 29 in the H level to the cell protection FET circuit 5*b*. The MOSFET 22 is turned on in response to the gate control signal 28 in the H level. Moreover, the MOSFET 23 is turned on in response to the gate control signal 29 in the H level. However, it is supposed that the gate control signals 26 and 27 and the gate control signals 28 and 29 are the same potential. At this time, the FET control section 11 outputs the gate control signals 30 and 31 in the L level to the cell protection FET circuit 5*b*. Therefore, the MOSFET 24 and the MOSFET 25 are turned off together.

At this time, the current control circuit 43 operates such that the source voltage of the MOSFET 20 and the source voltage of the MOSFET 22 become euqipotential. Because the drains and the gates are respectively connected in common, the MOSFET 20 and the MOSFET 22 operate as the current mirror circuit. Here, it is supposed that the ratio of the number of unit cells of the MOSFET 20 and the number of unit cells of the MOSFET 22 is 20000:100. In this case, the detection current Idr of 100/20000 of the discharge current Id which flows through the MOSFET 20 flows through the current detection resistance R16 via the MOSFET 22 and the current control circuit 43. The ADC 12 reads (analog signal) the voltage Vdr across the both ends of the current detection resistance R16, and converts the read result into a digital signal to output to the CPU 9. The CPU 9 calculates the discharge current Id (Id=Vdr/R16×20000/ 100) and calculates the used electric quantity by accumulating the discharge current Id. Then, the CPU 9 calculates the residual quantity of the secondary battery 2 by subtracting the used electric quantity from the electric quantity (stored in the CPU 9 or the external storage section) stored in the charging operation. The CPU 9 outputs the calculated residual quantity of the secondary battery 2 to the external equipment through the serial IF 10.

The detection current Idr which flows through the MOSFET 22 becomes very small in case where the discharge current Id is decreased through the discharge or in a low consumption current mode like a standby mode. Therefore, there is a fear that the measurement precision is degraded. Therefore, the CPU 9 instructs the FET control section 11 to change the path of the detection current when the discharge current Id becomes less than a predetermined value (stored in the CPU 9 or the external storage section). The FET control section 11 outputs the gate control signal 30 in the H level and the gate control signal 28 in the L level to the cell protection FET circuit 5b. The MOSFET 24 is turned on in response to the gate control signal 30 in the H level. The MOSFET 22 is turned off in response to the gate control signal 28 in the L level. Here, it is supposed that the gate control signal 26 and the gate control signal 30 have the same potential. Thus, because the drain and the gate are connected in common, the MOSFET 20 and the MOSFET 24 operate as a current mirror circuit. Here, it is supposed that the ratio of the number of unit cells of the MOSFET 20 and the number of unit cells of the MOSFET 24 is 20000: 200. In this case, the detection current Idr of 200/20000 of the discharge current Id which flows through the MOSFET 20 flows through the current detection resistance R16 via the current control circuit 43. The ADC 12 reads (analog signal) the voltage Vdr across the both ends of the current detection resistance R16, and converts the read result into the digital signal to output to the CPU 9. The CPU 9 calculates the discharge current Id (Id=Vdr/R16×20000/200) and calculates the used electric quantity by accumulating the discharge current Id. Then, the CPU 9 calculates the residual quantity of the secondary battery 2 by subtracting the used electric quantity from the electric quantity (stored in the CPU 9 or the external storage section) stored in the charging operation. The CPU 9 outputs the calculated residual quantity of the secondary battery 2 to the external equipment through the serial IF 10.

When the discharge current Id is decreased more and becomes less than another predetermined value (stored in the CPU 9 or the external storage section), the CPU 9 instructs the FET control section 11 to add another path of the detection current. The FET control section 11 outputs the gate control signal 28 and gate control signal 30 in the H level to the cell protection FET circuit 5b. The MOSFET 22 is turned on in response to the gate control signal 28 in the H level. The MOSFET 24 is turned on in response to the gate control signal 30 in the H level. Here, it is supposed that the gate control signal 26, the gate control signal 28 and the gate control signal 30 have the same potential. Thus, because the drains and the gates are respectively connected in common, the MOSFET 20, the MOSFET 22 and the MOSFET 24 operate as a current mirror circuit. Here, the ratio of the number of unit cells of the MOSFET 20, the number of unit cells of the MOSFET 22 and the number of unit cells of the MOSFET 24 is 20000:100:200. In this case, the detection current Idr of 300/20000 of the discharge current Id which flows through the MOSFET 20 flows through the current detection resistance R16 via the current control circuit 43. The ADC 12 reads (analog signal) the voltage Vdr across the both ends of the current detection resistance R16, and converts the read result into a digital signal to output to the CPU 9. The CPU 9 calculates the discharge current Id (Id=Vdr/R16×20000/(100+200)), and calculates the used electric quantity by accumulating the discharge current Id. Then, the CPU 9 calculates the residual quantity of the secondary battery 2 by subtracting the used electric quantity from the electric quantity (stored in the CPU 9 or the external storage section) stored in the charging operation. The CPU 9 outputs the calculated residual quantity of the secondary battery 2 to the external equipment through the serial IF 10.

In this way, in the present embodiment, in addition to the discharge current detection MOSFET 22, the discharge current detection MOSFET 24 is provided in parallel to the MOSFET 22. The number of unit cells of the MOSFET 24 and the number of unit cells of the MOSFET 22 are set to be different. As a result, in case where the discharge current Id should be detected, when the discharge current Id is large, the discharge current Id is measured by using the detection current Idr only from the MOSFET 22, and when the discharge current Id is small, the discharge current Id is measured by using the detection current Idr from the MOSFET 22 and/or the MOSFET 24. That is, by changing the detection current ratio (Idr/Id) according to the magnitude of the discharge current Id ($2^2-1=3$ cases), the detection range to detect the discharge current Id can be selected. As a result, the detection of the high precision can be carried out regardless of the magnitude of the discharge current Id.

Also, the operation of the over-current and the residual quantity lack is same as that of the first embodiment, and the explanation is omitted.

Next, the charging operation of the cell pack will be described. The positive electrode of a charging device (not shown) is connected with the terminal 6 on the side of the positive electrode of the secondary battery 2 and the negative electrode of the charging device is connected with the terminal 7 on the side of the negative electrode of the secondary battery 2. The CPU 9 instructs the FET control section 11 to connect the charge path. The FET control section 11 outputs the gate control signal 26 and gate control signal 27 in the H level to the cell protection FET circuit 5b. The MOSFET 20 is turned on in response to the gate control signal 26 in the H level. Moreover, the MOSFET 21 is turned on in response to the gate control signal 27 in the H level. Thus, the charge path between the secondary battery 2 and the terminal 7 is connected and the charge current Ic flows in the direction of the arrow of FIG. 15. That is, the secondary battery 2 performs the charging operation. Also, the FET control section 11 outputs the gate control signal 28 and the gate control signal 29 in the H level to the cell protection FET circuit 5b. The MOSFET 22 is turned on in response to the gate control signal 28 in the H level. Moreover, the MOSFET 23 is turned on in response to the gate control signal 29 in the H level. Here, it is supposed that the gate control signals 26 and 27 and the gate control signals 28 and 29 have the same potential. At this time, the FET control section 11 outputs the gate control signals 30 and 31 in the L level to the cell protection FET circuit 5b. Therefore, the MOSFET 24 and the MOSFET 25 are turned off together.

At this time, the current control circuit 44 operates such that the source voltage of the MOSFET 21 and the source voltage of the MOSFET 23 become euqipotential. Because the drains and the gates are respectively connected in common, the MOSFET 21 and the MOSFET 23 operate as a current mirror circuit. Here, it is supposed that the ratio of the number of unit cells of the MOSFET 21 and the number of unit cells of the MOSFET 23 is 20000:100. In this case, the detection current Icr of 100/20000 of the charge current Ic which flows through the MOSFET 21 flows through the current detection resistance R19 via the MOSFET 23 and the current control circuit 44. The ADC 15 reads (analog signal) the voltage Vcr across the both ends of the current detection resistance R19, and converts the read result into the digital signal to output to the CPU 9. The CPU 9 calculates the charge current Ic (Ic=Vcr/R19×20000/100) and calculates the electric quantity stored in the secondary battery 2 by accumulating the charge current Ic. Then, the CPU 9 outputs the stored electric quantity to the external equipment through the serial IF 10.

When the secondary battery 2 approaches the full charge state so that the charge current Ic is decreased, the detection current Icr which flows through the MOSFET 23 becomes very small. Therefore, there is a fear that the measurement precision is degraded. Therefore, the CPU 9 instructs the FET control section 11 to change the path of the detection current when the charge current Ic becomes less than a predetermined value (stored in the CPU 9 or the external storage section). The FET control section 11 outputs the gate control signal 31 in the H level and the gate control signal 29 in the L level to the cell protection FET circuit 5b. The MOSFET 25 is turned on in response to the gate control signal 31 in the H level. The MOSFET 23 is turned off in response to the gate control signal 29 in the L level. Here, it is supposed that the gate control signal 27 and the gate control signal 31 have the same potential. Thus, because the drains and the gates are respectively connected in common, the MOSFET 21 and the MOSFET 25 operate as a current mirror circuit. Here, it is supposed that the ratio of the number of unit cells of the MOSFET 21 and the number of unit cells of the MOSFET 25 is 20000:200. In this case, the detection current Icr of 200/20000 of the charge current Ic which flows through the MOSFET 21 flows through the current detection resistance R19 via the current control circuit 44. The ADC 15 reads (analog signal) the voltage Vcr across the both ends of the current detection resistance R19, and converts the result into the digital signal to output to the CPU 9. The CPU 9 calculates the charge current Ic (Ic=Vcr/R19×20000/200) and calculates the electric quantity stored in the secondary battery by accumulating the charge current Ic. Then, the CPU 9 calculates the residual quantity of the secondary battery 2 by adding the stored electric quantity to the electric quantity (stored in the CPU 9 or the external storage section) left in case of the discharging operation. The CPU 9 outputs the calculated residual quantity of the secondary battery 2 to the external equipment through the serial IF 10.

When the charge current Ic is decreased more and becomes less than another predetermined value (stored in the CPU 9 or the external storage section), the CPU 9 instructs the FET control section 11 to add the path of the detection current. The FET control section 11 outputs the gate control signal 29 and the gate control signal 31 in the H level to the cell protection FET circuit 5b. The MOSFET 23 is turned on in response to the gate control signal 29 in the H level. The MOSFET 25 is turned on in response to the gate control signal 31 in the H level. Here, it is supposed that the gate control signal 27, the gate control signal 28 and the gate control signal 31 have the same potential. Thus, because the drains and the gates are respectively connected in common, the MOSFET 21, the MOSFET 23 and the MOSFET 25 operate as a current mirror circuit. Here, it is supposed that the ratio of the number of unit cells of the MOSFET 21, the number of unit cells of the MOSFET 23 and the number of unit cells of the MOSFET 25 is 20000:100:200. In this case, the detection current Icr of 300/20000 of the charge current Ic which flows through the MOSFET 21 flows through the current detection resistance R19 via the current control circuit 44. The ADC 15 reads (analog signal) the voltage Vcr across the both ends of the current detection resistance R19, and converts the result into a digital signal to output to the CPU 9. The CPU 9 calculates the charge current Ic (Ic=Vcr/R19×20000/(200+100)) and calculates the electric quantity store in the secondary battery by accumulating the charge current Ic. Then, the CPU 9 calculates the residual quantity of the secondary battery 2 by adding the stored electric quantity to the electric quantity (stored in the CPU 9 or the external storage section) left in case of the discharging operation. The CPU 9 outputs the calculated residual quantity of the secondary battery 2 to the external equipment through the serial IF 10.

In this way, in the present embodiment, in addition to the charge current detection MOSFET 23, the charge current detection MOSFET 25 is provided in parallel to the MOSFET 23. The number of unit cells of the MOSFET 25 and the number of unit cells of the MOSFET 23 are set to be different. As a result, in case where the charge current Ic should be detected, when the charge current Ic is large, the charge current Ic is measured by using the detection current Icr only from the MOSFET 23, and when the charge current Ic is small, the charge current Ic is measured by using the detection current Icr from the MOSFET 23 and/or the MOSFET 25. That is, by changing the detection current ratio (Icr/Ic) according to the magnitude of the charge current Ic ($2^2-1=3$ cases), the detection range to detect the charge current Ic can be selected. As a result, the detection of the high precision can be carried out regardless of the magnitude of the charge current Ic.

Also, the operation of the over-current and the full charge in the charging operation is same as that of the first embodiment, the explanation is omitted.

As mentioned above, the cell pack to which the cell protection system according to the present embodiment is applied operates.

It should be noted that in the present embodiment, the one MOSFET 24 is added for the discharge current detection. However, many MOSFETs may be added. For example, when a discharge current detection MOSFET 26 is further added, the MOSFET 26 has the following configuration. The MOSFET 26 differs from the MOSFETs 22 and 24 in the unit cell ratio, has the drain common with the MOSFET 22 and 24, and the source is connected with the current control circuit 43 and the gate is connected with the FET control section 11. In this case, of the MOSFETs 22, 24, 26, either of only the MOSFET 22, only the MOSFET 24 and only the MOSFET 26 can be used. Moreover, either of combinations of the MOSFET 22+the MOSFET 24, the MOSFET 22+the MOSFET 26, the MOSFET 24+the MOSFET 26, the MOSFET 22+the MOSFET 24+the MOSFET 26 can be used. There are 7 combinations ($=2^3-1$) in total. That is, the combinations of ($2^m-1$) (m is the number of the discharge current detection MOSFETs) becomes possible. Moreover, in such a case, the measurement range to measure a current can be increased, and the measurement (detection) of the high precision can be carried out.

In the same way, in the present embodiment, the one charge current detection MOSFET 25 is added but many MOSFETs may be added. For example, when adding a charge current detection MOSFET 27 is further added, it is supposed that the MOSFET 27 has the following configuration. The MOSFET 27 differs from the MOSFETs 23 and 25 in the unit cell ratio, and the drain is common with the MOSFETs 23 and 25, the source is connected with the current control circuit 44 and the gate is connected with the FET control section 11. In this case, of combinations of the MOSFETs 23, 25 and 27, only the MOSFET 23, only the MOSFET 25 and only the MOSFET 27 can be used. Moreover, either of combinations of the MOSFET 23+the MOSFET 25, the MOSFET 23+the MOSFET 27, the MOSFET 25+the MOSFET 27, the MOSFET 23+the MOSFET 25+the MOSFET 27 can be used. There are seven cases ($=2^3-1$) in total. That is, the ($2^n-1$) combinations (n is the number of the charge current detection MOSFETs) becomes possible. Moreover, in such a case, the measurement range to measure a current can be increased, and the measurement (detection) of the high precision can be carried out.

Because an example of the current control circuit 43 and the current control circuit 44 is the same as that of the first embodiment (FIG. 4), the explanation is omitted. Also, because it is same (FIG. 5, FIG. 6) as the first embodiment an example of the protection substrate on which the cell protection system is implemented and an example of the cell pack in which the cell protection system is implemented, the explanation is omitted.

The effect similar to that of the first embodiment can be obtained in the present embodiment.

Moreover, in the present embodiment, the detection current ratio can be changed according to the magnitude of the current to detect (measure). For example, when the discharge current Id and the charge current Ic are large, it is supposed that the detection current ratio is set to 1/200. When the discharge current Id and the charge current Ic are small, it is supposed that the detection current ratio is 2/200. When the discharge current Id and the charge current Ic are smaller, it is supposed that the detection current ratio is set to 3/200. Thus, the discharge current Id and the charge current Ic can be correctly detected in the wide detection range. Also, shown in FIG. 15, the circuit is configured from the control MOSFET of one set and the current detection MOSFETs of two sets. However, by using a current detection MOSFET of N sets which are more than two sets, the current ratios of ($2^N-1$) become possible and a current can be detected in the wider range. In this case, it is effective when the detection is carried out by changing a narrower range, compared with the second embodiment, <First Modification Example>

Comparing the cell pack 1 of FIG. 15, the cell pack 1 of the present modification example is different in that the current detection resistance is included in the control circuit. The difference will be mainly described below.

Figure 17:
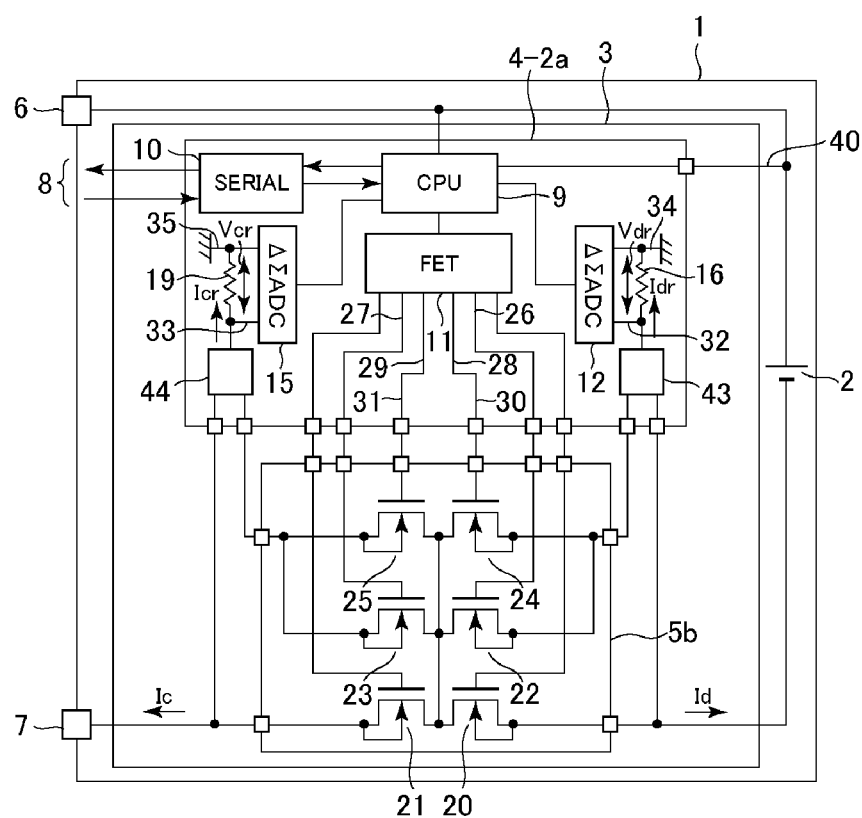
FIG. 17 is a block diagram showing the first modification example of the configuration of the cell pack to which the cell protection system according to the third embodiment is applied.

FIG. 17 is a block diagram showing a first modification example of the configuration of the cell pack to which the cell protection system according to the third embodiment is applied. The cell protection system 3 of the present modification example includes a control circuit 4-2a and the cell protection FET circuit 5b. Here, the current detection resistances 16 and 19 are not implemented as independent elements. The current detection resistances 16 and 19 is included in the control circuit 4-2a. When the control circuit 4-2a is provided as a 1-chip semiconductor circuit, the cost of the current detection resistances 16 and 19 can be reduced by including the current detection resistances 16 and 19. In addition, the configuration of the cell protection system 3 can be simplified and the manufacture can be facilitated. It should be noted that an example of the protection substrate 3a on which the cell protection system 3 is implemented is basically the same as an example (FIG. 8) of the protection substrate 3a on which the cell protection system 3 of the first modification example according to the first embodiment is implemented (here, the control circuit 4-2a and the cell protection FET circuit 5b are used instead of the control circuit 4a and the cell protection FET circuit 5). Therefore, the explanation is omitted.

In this case, the effect similar to the case of the cell pack 1 shown in FIG. 15 and FIG. 16 can be obtained.

<Second Modification Example>

Comparing the cell pack 1 of FIG. 15, the cell pack 1 of this modification example is different in that the current detection resistances and the cell protection FET circuit are included in the control circuit. The difference will be mainly described below.

Figure 18:
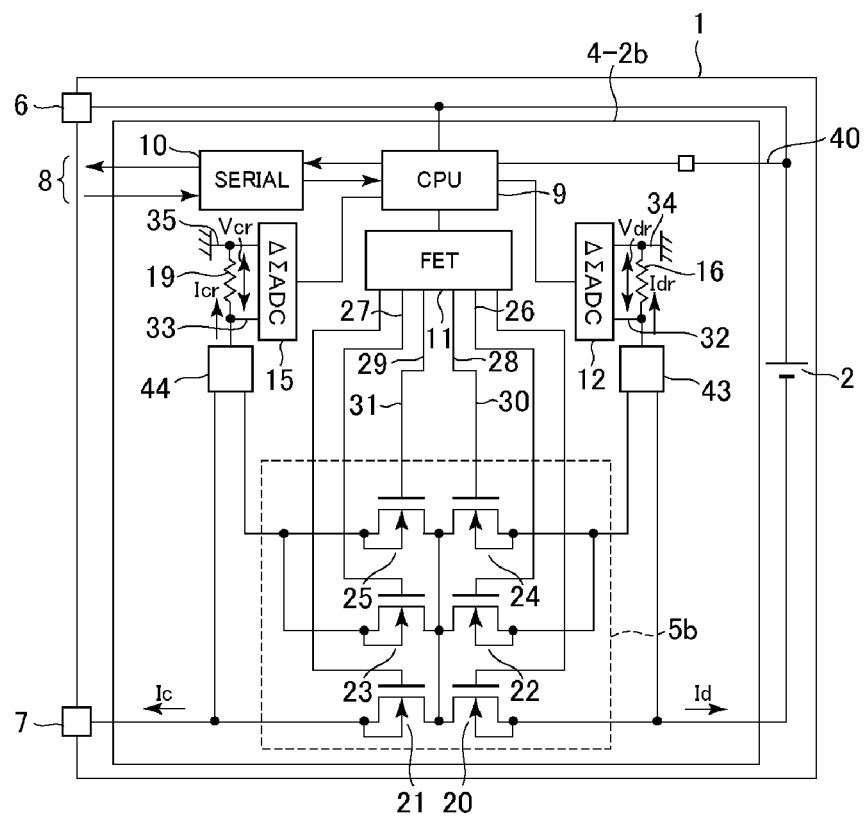
FIG. 18 is a block diagram showing the second modification example of the configuration of the cell pack to which the cell protection system according to the third embodiment is applied.

FIG. 18 is a block diagram showing a second modification example of the configuration of the cell pack to which the cell protection system according to the third embodiment is applied. The cell protection system 3 of this modification example includes a control circuit 4-2b. Here, the current detection resistances 16 and 19 and the cell protection FET circuit 5b are are implemented as independent elements. The current detection resistances 16 and 19 and the cell protection FET circuit 5b are included in the control circuit 4-2b. When the control circuit 4-2b is provided as a 1-chip semiconductor circuit, the cost of the current detection resistances 16 and 19 and the cell protection FET circuit 5b can be reduced by including the current detection resistances 16 and 19 and the cell protection FET circuit 5b. In addition, the configuration of the cell protection system 3 can be simplified and the manufacture can be facilitated. It should be noted that an example of the protection substrate 3a on which the cell protection system 3 is implemented is basically the same as an example (FIG. 10) of the protection substrate 3a on which the cell protection system 3 of the second modification example of the according to the first embodiment is implemented (here, the control circuit 4-2b and the cell protection FET circuit 5b are used instead of the control circuit 4b and the cell protection FET circuit 5). Therefore, the explanation is omitted.

In this case, the effect similar to a case of the cell pack 1 shown in FIG. 15 and FIG. 16 can be obtained.

[Fourth Embodiment]

The configuration of the cell pack to which the cell protection system according to a fourth embodiment is applied will be described. The present embodiment is different in the cell protection FET circuit, s current limitation circuit, a configuration and a control method of the ADC, comparing with the first embodiment. The difference will be mainly described below.

Figure 19:
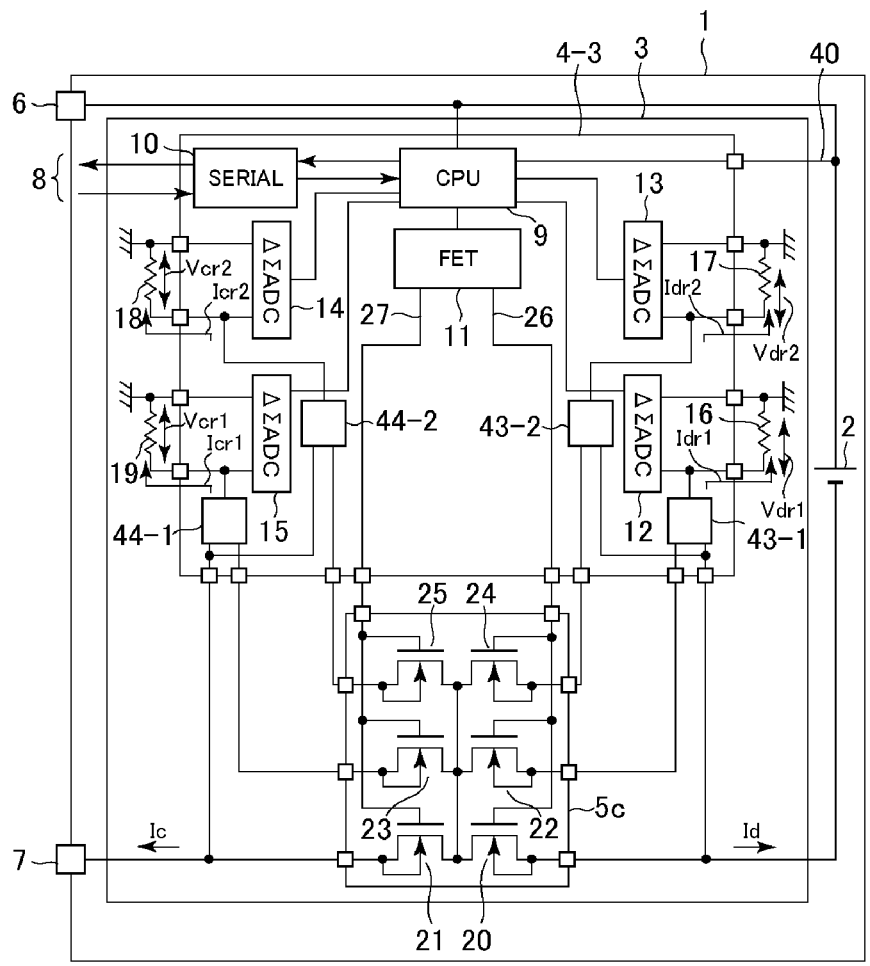
FIG. 19 is a block diagram showing a configuration example of the cell pack to which the cell protection system according to a fourth embodiment is applied.

FIG. 19 is a block diagram showing a configuration example of the cell pack which the cell protection system according to a fourth embodiment is applied. In the cell pack 1, the configuration of the cell protection FET circuit 5c differs from the cell protection FET circuit 5 of the first embodiment.

The cell protection FET circuit 5c controls the charging and discharging operations of the secondary battery 2 based on the control of the control circuit 4-3 and protects the secondary battery 2 from an abnormality. The cell protection FET circuit 5c may be provided as a 1-chip semiconductor circuit. The cell protection FET circuit 5c has the MOSFET 20, the MOSFET 21, the MOSFET 22, the MOSFET 23, the MOSFET 24, and the MOSFET 25.

The MOSFET 20 is a discharge control MOSFET and carries out an ON/OFF control of the power supply path through which the discharge current Id flows in case of the discharging operation. The MOSFET 22 is a discharge current detection MOSFET and outputs the detection current Idr1 corresponding to the discharge current Id. The MOSFET 24 is a discharge current detection MOSFET and outputs the detection current Idr2 corresponding to the discharge current Id. Here, the following relation is satisfied: the discharge current Id>>the detection current Idr2 by the MOSFET 24>the detection current Idr1 by the MOSFET 22. The drains and the gates are respectively connected in common with the MOSFET 20, the MOSFET 22 and the MOSFET 24. The sources of the MOSFET 20, 22 and 24 are possible to be connected with external wiring lines through terminals. The gates of the MOSFET 20, 22 and 24 are possible to be connected with external wiring lines through terminals. The source of the MOSFET 20 is connected with the negative electrode of the secondary battery 2. The source of the MOSFET 22 is connected with the current detection resistance 16 through the control circuit 4-3. The source of the MOSFET 24 is connected with the current detection resistance 17 through the control circuit 4-3. The gates of the MOSFET 20, the MOSFET 22 and the MOSFET 24 are connected with the FET control section 11. It is supposed that the number of unit cells of the MOSFET 20, the number of unit cells of the MOSFET 24 and the number of unit cells of the MOSFET 22 satisfy the relation of: the number of unit cells of the MOSFET 20>>the number of unit cells of the MOSFET 24>the number of unit cells of the MOSFET 22. Regarding the unit cell number ratio, large:middle:small. The reason is same as the second embodiment. For example, it is supported that the ratio of the number of unit cells of the MOSFET 20, the number of unit cells of the MOSFET 24 and the number of unit cells of the MOSFET 22 is 20000:200:1. It should be noted that a ratio of gate widths (or channel widths) may be used in place of the unit cell number ratio.

The MOSFET 21 is a charge control MOSFET and carries out an ON/OFF control of the power supply path through which the charge current Ic flows in the charging operation. The MOSFET 23 is a charge current detection MOSFET and outputs the detection current Icr1 corresponding to the charge current Ic. The MOSFET 25 is a charge current detection MOSFET and outputs the detection current Icr2 corresponding to the charge current Ic. Here, the following relation is satisfied: the charge current Ic>>the detection current Icr2 by the MOSFET 25>the detection current Icr1 by the MOSFET 23. The drains and the gates are respectively connected in common with the MOSFET 21, the MOSFET 23 and the MOSFET 25. The sources of the MOSFETs 21, 23 and 25 are possible to be connected with external wiring lines through terminals. The gates of the MOSFET 21, 23 and 25 are possible to be connected with external wiring lines through terminals. The source of the MOSFET 21 is connected with the terminal 7. The source of the MOSFET 23 is connected with the current detection resistance 19 through a control circuit 4-3. The source of the MOSFET 25 is connected with a current detection resistance 18 through the control circuit 4-3. The gates of the MOSFET 21, the MOSFET 23 and the MOSFET 25 are connected with the FET control section 11. It is supposed that the number of unit cells of the MOSFET 21, the number of unit cells of the MOSFET 25 and the number of unit cells of the MOSFET 23 satisfy the following relation: the number of unit cells of the MOSFET 21>>the number of unit cells of the MOSFET 25>the number of the unit cells of the MOSFET 23. Regarding the unit cell number ratio, large:middle:small. The reason is same as the second embodiment. For example, it is supposed that the ratio of the number of unit cells of the MOSFET 21, the number of unit cells of the MOSFET 25 and the number of unit cells of the MOSFET 23 is 20000:200:1. It should be noted that a ratio with gate widths (or channel widths) may be used in place of the unit cell number ratio.

The control circuit 4-3 includes a current control circuit 43-1, a current control circuit 43-2, a current control circuit 44-1, a current control circuit 44-2, and the ADC 12, 13, 14 and 15.

The current control circuit 43-1 is connected with the power supply path (the source of the MOSFET 20), the source of the MOSFET 22 and one end of the current detection resistance 16. The detection current Idr1 is passed from the MOSFET 22 into the current detection resistance 16 such that the source of the MOSFET 20 and the source of the MOSFET 22 become euqipotential. The current control circuit 43-2 is connected with the power supply path (the source of the MOSFET 20), the source of the MOSFET 24 and one end of the current detection resistance 17. The detection current Idr2 is passed from the MOSFET 24 into the current detection resistance 17 such that the source of the MOSFET 20 and the source of the MOSFET 24 become euqipotential.

The current control circuit 44-1 is connected with the power supply path (the source of the MOSFET 21), the source of the MOSFET 23 and one end of the current detection resistance 19. The detection current Icr1 is passed from the MOSFET 23 to the current detection resistance 19 such that the source of the MOSFET 21 and the source of the MOSFET 23 become euqipotential. The current control circuit 44-2 is connected with the power supply path (the source of the MOSFET 21), the source of the MOSFET 25 and one end of the current detection resistance 18. The detection current Icr2 is passed from the MOSFET 25 into the current detection resistance 18 such that the source of the MOSFET 21 and the source of the MOSFET 25 become euqipotential.

The ADC 12 converts the voltage (analog) of the current detection resistance 16 when the detection current Idr1 flows through the resistance 16 into a digital and outputs it to the CPU 9. The ADC 12 is a discharge current detection ADC, and is provided to correspond to the discharge current detection MOSFET 22. The ADC 12 is provided to correspond to the current detection resistance 16. The ADC 13 converts the voltage (analog) of the current detection resistance 17 when the detection current Idr2 flows into a digital and outputs it to the CPU 9. The ADC 13 is a discharge current detection ADC, and is provided to correspond to the discharge current detection MOSFET 24. The ADC 13 is provided to correspond to the current detection resistance 17.

The ADC 15 converts a voltage (analog) of the current detection resistance 19 when the detection current Icr1 flows into a digital signal and outputs it to the CPU 9. The ADC 15 is a charge current detection ADC, and is provided to correspond to the charge current detection MOSFET 23. The ADC 15 is provided to correspond to the current detection resistance 19. The ADC 14 converts a voltage (analog) of the current detection resistance 18 when the detection current Icr2 flows into a digital signal and outputs it to the CPU 9. The ADC 14 is a charge current detection ADC, and is provided to correspond to the charge current detection MOSFET 25. The ADC 15 is provided to correspond to the current detection resistance 18.

The FET control section 11 of the control circuit 4-3 is connected with the gates of the MOSFET 20, the MOSFET 22, the MOSFET 24, the MOSFET 21, the MOSFET 23 and the MOSFET 25 of the cell protection FET circuit 5*c*. The FET control section 11 controls the gate voltage of each MOSFET of the cell protection FET circuit 5*c* based on the control of the CPU 9, and carries out an ON/OFF control of each MOSFET.

One end of the current detection resistance 16 is connected with the source of the MOSFET 22 of the cell protection FET circuit 5*c* through the current control circuit 43-1 and the other end is connected with the GND. Moreover, one end and the other end of the current detection resistance 16 are connected with the ADC 12. The current detection resistance 16 is a discharge current detection resistance, and is provided to correspond to the discharge current detection MOSFET 22. One end of the current detection resistance 17 is connected with the source of the MOSFET 24 of the cell protection FET circuit 5*c* through the current control circuit 43-2 and the other end is connected with the GND. Moreover, one end and the other end of the current detection resistance 17 are connected with the ADC 13. The current detection resistance 17 is a discharge current detection resistance, and is provided to correspond to the discharge current detection MOSFET 24.

One end of the current detection resistance 19 is connected with the source of the MOSFET 23 of the cell protection FET circuit 5*c* through the current control circuit 44-1 of the control circuit 4-3 and the other end is connected with the GND. Moreover, one end and the other end of the current detection resistance 19 are connected with the ADC 15. The current detection resistance 19 is a charge current detection resistance, and is provided to correspond to the charge current detection MOSFET 23. One end of the current detection resistance 18 is connected with the source of the MOSFET 25 of the cell protection FET circuit 5*c* through the current control circuit 44-2 of the control circuit 4-3 and the other end is connected with the GND. Moreover, one end and the other end of the current detection resistance 18 are connected with the ADC 14. The current detection resistance 18 is a charge current detection resistance, and is provided to correspond to the MOSFET 25 for the charge current detection.

The current detection resistances 16 to 19 may be provided as independent elements.

The other configuration is same as the first embodiment, and the explanation is omitted.

Figure 20:
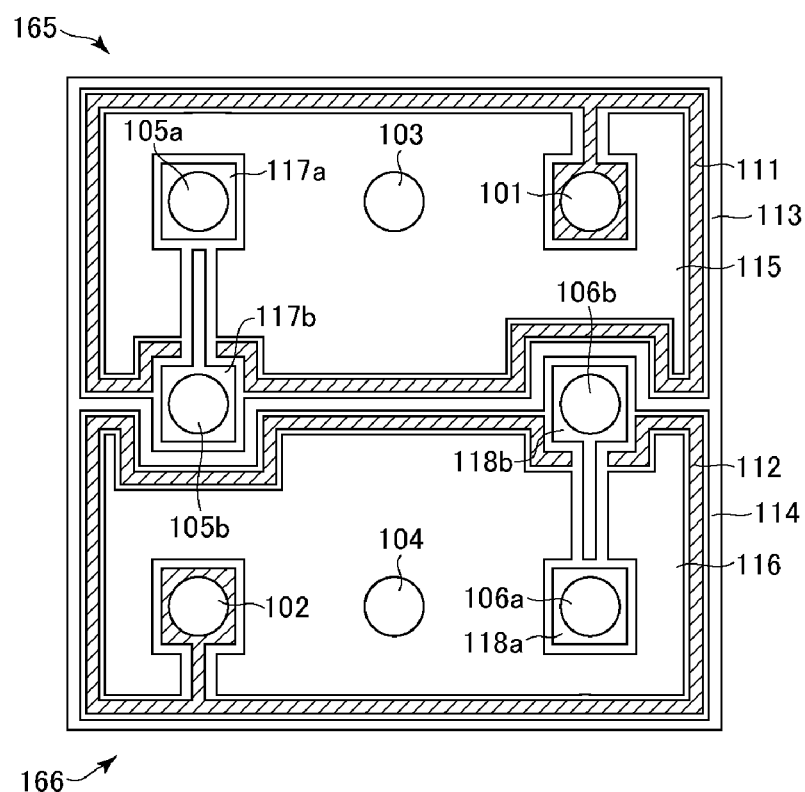
FIG. 20 is a plan view showing a configuration example of the cell protection FET circuit 5 shown in FIG. 19.

FIG. 20 is a plan view showing a configuration example of the cell protection FET circuit 5*c* shown in FIG. 19. For example, here, the area 165 corresponds to the charge control MOSFET 21, and the charge current detection MOSFETs 23 and 25. The area 166 corresponds to the discharge control MOSFET 20, and the discharge current detection MOSFETs 22 and 24. Because the area 165 and the area 166 have the same configuration and is the point symmetry with respect to the center of the drawing, the area 165 will be mainly described below.

The area 165 is surrounded with the euqipotential ring 113. Comparing with the first embodiment, the MOSFET 25 having the common gate is added to the area 165 in the present embodiment to dispose the MOSFETs 21, 23 and 25. The plurality of MOSFETs in the area surrounded with the gate wiring line 111 configure the charge control MOSFET 21, and the charge current detection MOSFETs 23 and 25. For example, it is supposed that an MOSFET in a predetermined area of the area surrounded with the gate wiring line 111 is the MOSFET 23 and it is supposed that a MOSFET in a predetermined area of the area surrounded with the gate wiring line 111 and wider than the MOSFET 23 is the MOSFET 25. Then, it is supposed that a MOSFET in the remainder of the area surrounded with the gate wiring line 111 is the MOSFET 21. The section of each unit cell of the MOSFETs 21 and 23 is the same as the section of each unit cell of the MOSFETs 21 and 23 shown in FIG. 3. The section of the unit cell of the MOSFET 25 is the same as the section of the unit cell of the MOSFET 23 shown in FIG. 3. For example, at this time, the ratio of the area of the MOSFET 23 (equivalent to the number of unit cells), the area of the MOSFET 25 (equivalent to the number of unit cells) and the area of the MOSFET 21 (equivalent to the number of unit cells) can be set to be 100:200:20000.

The source of the MOSFET 23 is connected with a source electrode 117*a* through a contact. The source electrode 117*a* is connected with a source terminal 105*a*. The source of the MOSFET 25 is connected with the source electrode 117*b* through a contact. The source electrode 117*b* is connected with a source terminal 105*b*. On the other hand, the source of the MOSFET 21 is connected with the source electrode 115 through a contact. The source electrode 115 is connected with the source terminal 103. The gates of the MOSFET 21, the MOSFET 23 and the MOSFET 25 are connected with the gate wiring line 111 through contacts. The gate wiring line 111 is connected with the gate terminal 101. It should be noted that the drain electrode is common to the MOSFETs 21, 23 and 25 and are provided on the back side of the semiconductor chip.

It should be noted that the area 166 is surrounded with the euqipotential ring 114. The discharge control MOSFET 20, the discharge current detection MOSFETs 22 and 24, the gate wiring lines 112 and the gate terminal 102 are provided in the area 166. Moreover, the source electrode 116 of the MOSFET 20, the source terminal 104, and a source electrode 118*a* of the MOSFET 22, a source terminal 106*a*, a source electrode 118*b* of the MOSFET 24 and a source terminal 106*b* are provided. It should be noted that the drain electrode is common to the MOSFETs 20, 22 and 24, and the MOSFETs 21, 23 and 25 and is provided on the back side of the semiconductor chip.

In the present embodiment, because the CSP-type configuration is adopted like the first embodiment, the turn-on resistance of the MOSFET can be suppressed low. Also, because it is not necessary to provide the drain electrode of each MOSFET on the front surface, the problem does not occur that an effective cell area cannot be made large and the chip size becomes large.

Also, the present embodiment adopts the semiconductor chip of the CSP type in which eight terminals are arranged in a square in a constant interval. Because the eight terminals are arranged along four side of the semiconductor chip as shown in FIG. 12, a layout of wiring lines corresponding to each terminal on the side of the protection substrate 3*a* becomes easy.

Next, the operation of the cell pack to which the cell protection system according to the present embodiment is applied will be described.

First, the discharging operation of the cell pack will be described. A load (not shown) is connected between the terminal 6 and the terminal 7. The CPU 9 instructs the FET control section 11 to connect a discharge path. The FET control section 11 outputs the gate control signal 26 in the H level to the cell protection FET circuit 5c. The MOSFETs 20, 22 and 24 are turned on in response to the gate control signal 26 in the H level. Moreover, the MOSFETs 21, 23 and 25 are turned on in response to the gate control signal 27 in the H level. Thus, the discharge path between the secondary battery 2 and the terminal 7 is connected and the discharge current Id flows in the direction of the arrow of FIG. 19. That is, the secondary battery 2 performs the discharging operation.

At this time, the current control circuit 43-1 operates such that the source voltage of the MOSFET 20 and the source voltage of the MOSFET 22 become euqipotential. Because the drains and the gates are respectively connected in common, the MOSFET 20 and the MOSFET 22 operate as a current mirror circuit. Here, it is supposed that the ratio of the number of unit cells of the MOSFET 20 and the number of unit cells of the MOSFET 22 is 20000:1. In this case, the detection current Idr1 of 1/20000 of the discharge current Id which flows through the MOSFET 20 flows through the current detection resistance R16 via the MOSFET 22 and the current control circuit 43-1. The ADC 12 reads (analog signal) the voltage Vdr1 across the both ends of the current detection resistance R16, and converts the read result into the digital signal to output to the CPU 9. The CPU 9 calculates the discharge current Id (Id=Vdr1/R16×20000). On the other hand, the current control circuit 43-2 operates such that the source voltage of the MOSFET 20 and the source voltage of the MOSFET 24 become equal. Because the drains and the gates are respectively connected in common, the MOSFET 20 and the MOSFET 24 operate as a current mirror circuit. Here, it is supposed that the ratio of the number of unit cells of the MOSFET 20 and the number of unit cells of the MOSFET 24 is 20000:200. In this case, the detection current Idr2 of 1/100 of the discharge current Id which flows through the MOSFET 20 flows through the current detection resistance R17 via the MOSFET 24 and the current control circuit 43-2. The ADC 13 reads (analog signal) the voltage Vdr2 across the both ends of the current detection resistance R17, and converts the read result into the digital signal to output to the CPU 9. The CPU 9 calculates the discharge current Id (Id=Vdr2/R17×20000/200). There is magnitude of an error but the discharge current Id which is based on the value of the ADC 12 and the discharge current Id which is based on the value of the ADC 13 have almost the same value. When the CPU 9 determines that the discharge current Id is a large current (larger than a predetermined value (stored in the CPU 9 or the external storage section)) based on the discharge currents Id, the CPU 9 adopts the discharge current Id which is based on the value of the ADC 12. On the other hand, when the discharge current Id is a small current (when smaller than the predetermined value), the CPU 9 adopts the discharge current Id which is based on the value of the ADC 13. The CPU 9 calculates the used electric quantity by accumulating the discharge current Id. Then, the CPU 9 calculates the residual quantity of the secondary battery 2 by subtracting the used electric quantity from the electric quantity (stored in the CPU 9 or the external storage section) stored in the charging operation. The CPU 9 outputs the calculated residual quantity of the secondary battery 2 to the external equipment through the serial IF 10.

In this way, in the present embodiment, in addition to the discharge current detection MOSFET 22, the discharge current detection MOSFET 24 is provided in parallel with the MOSFET 22. The number of unit cells of the MOSFET 24 and the number of unit cells of the MOSFET 22 are set to be different. As a result, in case where the discharge current Id should be detected, when the discharge current Id is large, the discharge current Id is measured by using the detection current Idr1 from the MOSFET 22 and when the discharge current Id is small, the discharge current Id is measured by using the detection current Idr2 from the MOSFET 24. That is, by changing the detection current ratio (Idr/Id) according to the magnitude of the discharge current Id, the detection range to detect the discharge current Id can be selected. As a result, the detection of the high precision can be carried out regardless of the magnitude of the discharge current Id.

Also, the operation of the over-current and the residual quantity lack is same as that of the first embodiment and the explanation is omitted.

Next, the charging operation of the cell pack will be described. The positive electrode of a charging device (not shown) is connected with the terminal 6 on the side of the positive electrode of the secondary battery 2 and the negative electrode of the charging device is connected with the terminal 7 on the side of the negative electrode of the secondary battery 2. The CPU 9 instructs the FET control section 11 to connect a charge path. The FET control section 11 outputs the gate control signal 26 and the gate control signal 27 in the H level to the cell protection FET circuit 5c. The MOSFETs 20, 22 and 24 are turned on in response to the gate control signal 26 in the H level. Moreover, the MOSFETs 21, 23 and 25 are turned on in response to the gate control signal 27 in the H level. Thus, the charge path between the secondary battery 2 and the terminal 7 is connected and the charge current Ic flows in the direction of the arrow of FIG. 19. That is, the secondary battery 2 becomes the charging operation.

At this time, the current control circuit 44-1 operates such that the source voltage of the MOSFET 21 and the source voltage of the MOSFET 23 become equal. Because the drains and the gates are respectively connected in common, the MOSFET 21 and the MOSFET 23 operate as a current mirror circuit. Here, it is supposed that the ratio of the number of unit cells of the MOSFET 21 and the number of unit cells of the MOSFET 23 is 20000:1. In this case, the detection current Icr1 of 1/20000 of the charge current Ic which flows through the MOSFET 21 flows through the current detection resistance R19 via the MOSFET 23 and the current control circuit 44-1. The ADC 15 reads (analog signal) the voltage Vcr1 across the both ends of the current detection resistance R19, and converts the read result into a digital signal to output to the CPU 9. The CPU 9 calculates the charge current Ic (Ic=Vcr1/R19×20000). On the other hand, the current control circuit 44-2 operates such that the source voltage of the MOSFET 21 and the source voltage of the MOSFET 25 become equal. Because the drains and the gates are respectively connected in common, the MOSFET 21 and the MOSFET 25 operate as a current mirror circuit. Here, it is supposed that the ratio of the number of unit cells of the MOSFET 21 and the number of unit cells of the MOSFET 25 is 20000:200. In this case, the detection current Icr2 of 1/100 of the charge current Ic which flows through the MOSFET 21 flows through the current detection resistance R18 via the MOSFET 25 and the current control circuit 44-2. The ADC 14 reads (analog signal) the voltage Vcr2 across the both ends of the current detection resistance R18, and converts the read result into a digital signal to outputs to the CPU 9. The CPU 9 calculates the charge current Ic (Ic=Vcr2/R18×20000/200). The charge current Ic which is based on the value of the ADC 15 and the charge current Ic which is based on the value of the ADC 14 have different errors but have almost the same value. The CPU 9 adopts the charge current Ic which is based on the value of the ADC 15 when the CPU 9 determines that the charge current Ic is a large current based on the charge currents Ic (when larger than a predetermined value (stored in the CPU 9 or the external storage section)). On the other hand, when the charge current Ic is a small current (when smaller than the predetermined value), the CPU 9 adopts the charge current Ic which is based on the value of the ADC 14. The CPU 9 calculates the electric quantity stored by accumulating the charge current Ic. Then, the CPU 9 calculates the residual quantity of the secondary battery 2 by adding the stored electric quantity to the electric quantity (stored in the CPU 9 or the external storage section) left in case of the discharging operation. The CPU 9 outputs the calculated residual quantity of the secondary battery 2 to the external equipment through the serial IF 10.

In this way, in the present embodiment, in addition to the charge current detection MOSFET 23, the charge current detection MOSFET 25 is provided in parallel with the MOSFET 23. The number of unit cells of the MOSFET 25, and the number of unit cells of the MOSFET 23 are set to be different. As a result, in case where the charge current Ic should be detected, when the charge current Ic is large, the charge current Ic is measured by using the detection current Icr1 from the MOSFET 23 and when the charge current Ic is small, the charge current Ic is measured by using the detection current Icr2 from the MOSFET 25. That is, by changing the detection current ratio (Icr/Ic) according to the magnitude of the charge current Ic, the detection range to detect the charge current Ic can be selected. As a result, the detection of the high precision can be carried out regardless of the magnitude of the charge current Ic.

Also, the operation of the over-current and the full charge in the charging operation is same as the first embodiment, and the explanation is omitted.

As mentioned above, the cell pack to which the cell protection system according to the present embodiment is applied operates.

It should be noted that in the present embodiment, the one MOSFET 24 is added for the discharge current detection but many MOSFETs may be added. For example, when the discharge current detection MOSFET 26 is further added, the MOSFET 26 has the following configuration. The MOSFET 26 differs from the MOSFETs 22 and 24 in the unit cell ratio, the drain and the gate of the MOSFET 26 are shared by the MOSFETs 22 and 24 and the source is connected with a newly added current detection resistance R via a newly added current control circuit 43-3. In this case, of the MOSFETs 22, 24 and 26, either of only the MOSFET 22, only the MOSFET 24 and only the MOSFET 26 can be used. In such a case, the detection current ratio (Idr/Id) can be changed according to the magnitude of the discharge current Id, the measurement range to measure a current can be increased and the measurement (the detection) of the high precision can be carried out.

In the same way, in the present embodiment, the one MOSFET 25 is added for the charge current detection, but, many MOSFETs may be added. For example, when the charge current detection MOSFET 27 is further added, the MOSFET 27 has the following configuration. The MOSFET 27 differs from the MOSFETs 23 and 25 in the unit cell ratio, the drain and the gate of the MOSFET 27 are shared by the MOSFETs 23 and 25 and the source is connected with the newly added current detection resistance R via a newly added current control circuit 44-3. In this case, of the MOSFETs 23, 25 and 27, either of only the MOSFET 23, only the MOSFET 25 and only the MOSFET 27 can be used. In such a case, the detection current ratio (Icr/Ic) can be changed according to the magnitude of the charge current Ic, the measurement range to measure a current can be increased, and moreover the measurement (the detection) of the high precision can be carried out.

Because an example of the current control circuit 43 and the current control circuit 44 is same (FIG. 4) as that of the first embodiment, the explanation is omitted. Also, because an example of the protection substrate on which the cell protection system is implemented and an example of the cell pack in which the cell protection system is implemented are same as those of the first embodiment (FIG. 5, FIG. 6), the explanation is omitted.

The effect similar to that of the first embodiment can be obtained in the present embodiment.

Moreover, the effect similar to that of the second embodiment can be obtained in the present embodiment. Especially, when the influence of the error of a current accumulation quantity by the ON/OFF operation of the current detection MOSFET is considered when changing the current ratio in the second embodiment, it is desirable to use the present embodiment. In the present embodiment, because the current detection MOSFET 22, 24, 23 and 25 are always turned on, there is not an ON/OFF operation of the current detection MOSFETs in the changing the current ratio so that an error of the current accumulation quantity is not caused.

<First Modification Example>

Compared with the cell pack 1 shown in FIG. 19, the cell pack 1 in this modification example has a difference in that the current detection resistances are included in the control circuit. The difference will be mainly described.

Figure 21:
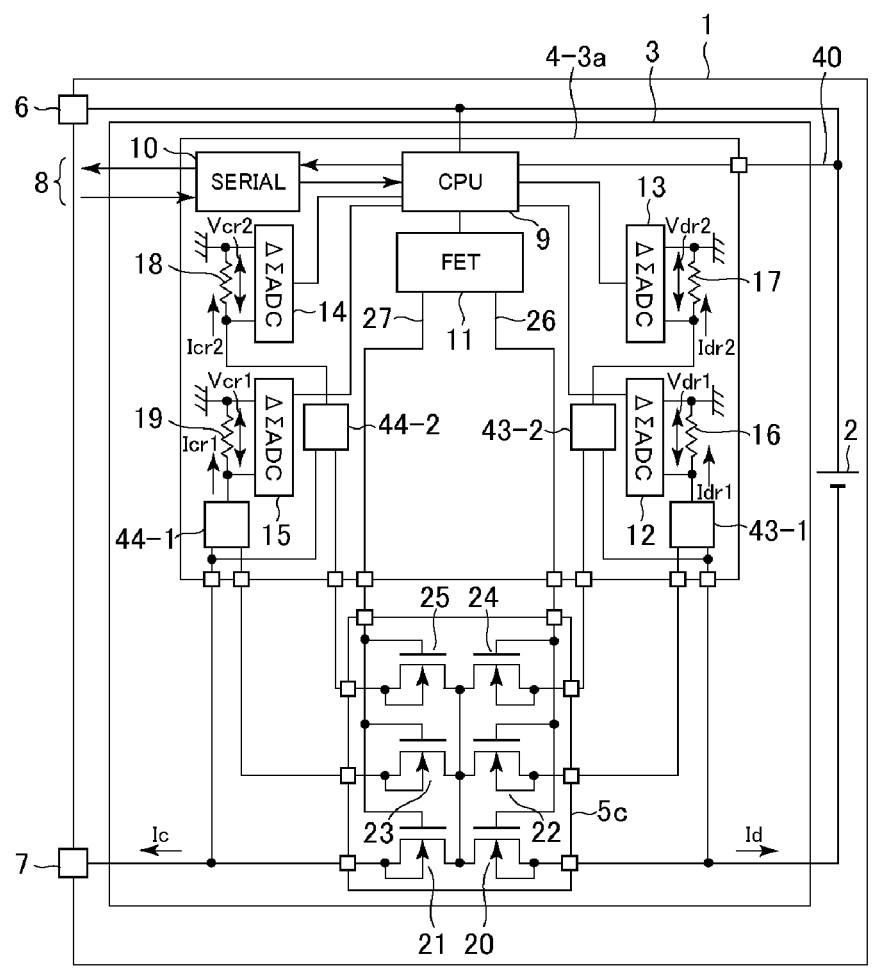
FIG. 21 is a block diagram showing the first modification example of the configuration of the cell pack to which the cell protection system according to the fourth embodiment is applied.

FIG. 21 is a block diagram showing a first modification example of the configuration of the cell pack to which the cell protection system according to a fourth embodiment is applied. The cell protection system 3 of this modification example includes a control circuit 4-3a and a cell protection FET circuit 5c. Here, the current detection resistances 16 to 19 are not implemented as independent elements. The current detection resistances 16 to 19 are included in the control circuit 4-3a. In such a case, when the control circuit 4-3a is provided as a 1-chip semiconductor circuit, the cost of the current detection resistances 16 to 19 can be reduced by containing the current detection resistances 16 to 19. In addition, the configuration of the cell protection system 3 can be simplified and the manufacture can be facilitated. It should be noted that an example of the protection substrate 3a on which the cell protection system 3 is implemented is basically the same as an example (FIG. 8) of the protection substrate 3a which implemented the cell protection system 3 of the first modification example according to the first embodiment (the control circuit 4-3a and the cell protection FET circuit 5c are used instead of the control circuit 4a and the cell protection FET circuit 5). Therefore, the explanation is omitted.

In this case, the effect similar in the case of the cell pack 1 shown in FIG. 19 and FIG. 20 can be obtained.

<Second Modification Example>

Compared with the cell pack 1 of FIG. 19, the cell pack 1 of this modification example is different in that the current detection resistances and the cell protection FET circuit are included in the control circuit in this modification example. The difference will be mainly described below.

Figure 22:
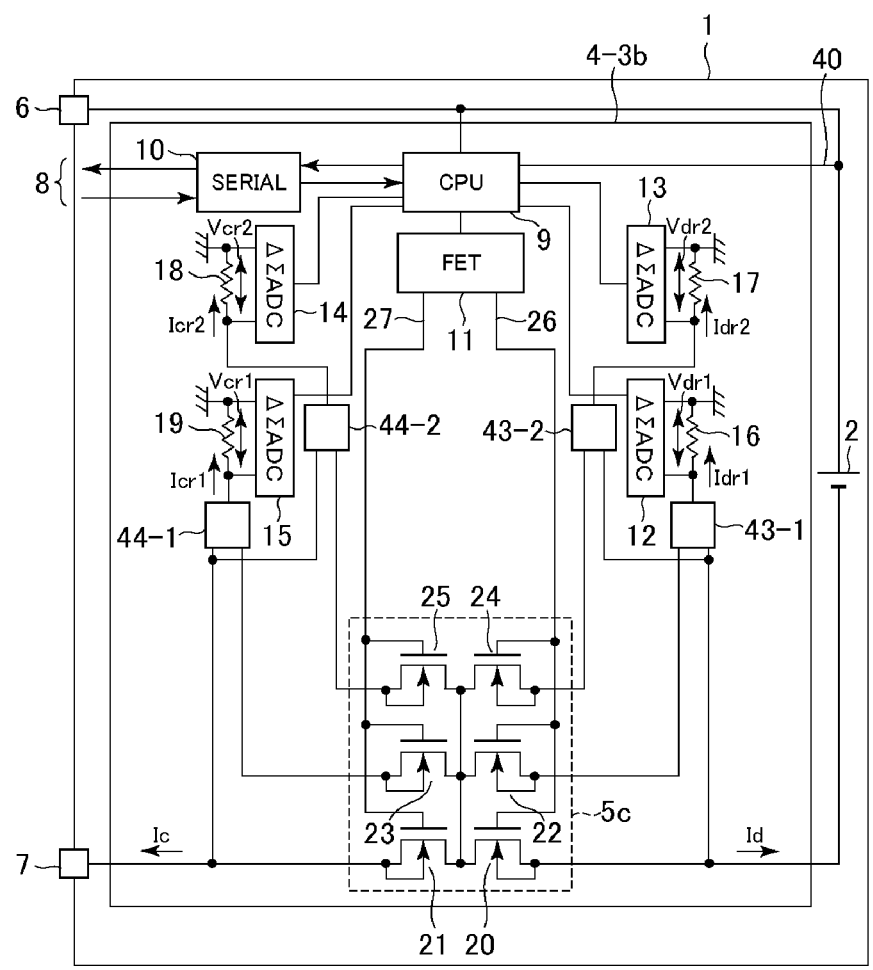
FIG. 22 is a block diagram showing the second modification example of the configuration of the cell pack to which the cell protection system according to the fourth embodiment is applied.

FIG. 22 is a block diagram showing a second modification example of the configuration of the cell pack to which the cell protection system according to a fourth embodiment is applied. The cell protection system 3 of this modification example includes a control circuit 4-3b. Here, the current detection resistances 16 to 19 and the cell protection FET circuit 5c are not implemented as independent elements. The current detection resistances 16 to 19 and the cell protection FET circuit 5c are included in the control circuit 4-3b. By including the current detection resistances 16 to 19 and the cell protection FET circuit 5c when the control circuit 4-3b is provided as a 1-chip semiconductor circuit, the cost for the current detection resistances 16 to 19 and the cell protection FET circuit 5c can be reduced. In addition, the configuration of the cell protection system 3 can be simplified and the manufacture can be facilitated. It should be noted that an example of the protection substrate 3a on which the cell protection system 3 is implemented, it is basically the same as an example (FIG. 10) of the protection substrate 3a on which the cell protection system 3 of the second modification example according to the first embodiment is implemented (Here, the control circuit 4-3b and the cell protection FET circuit 5c are used instead of the control circuit 4b and the cell protection FET circuit 5). Therefore, the explanation is omitted.

In this case, the effect similar to the case of the cell pack 1 shown in FIG. 19 and FIG. 20 can be obtained.

A part or all of the above-mentioned embodiments and modification examples can be mentioned as shown in the following notes, but are not limited by them.

(Note 1)

A cell protection system includes:

a charge control MOSFET;

a charge current detection MOSFET having a drain and a gate which are common with the charge control MOSFET and having a cell ratio which is different from that of the charge control MOSFET;

a discharge control MOSFET having a drain common with the charge control MOSFET;

a discharge current detection MOSFET having a drain and a gate which are common with the discharge control MOSFET and having a cell ratio which is different from that of the discharge control MOSFET;

a charge current detection resistance provided in correspondence to the charge current detection MOSFET;

a discharge current detection resistance provided in correspondence to the discharge current detection MOSFET; and a control circuit configured to generate a control signal which is supplied to gates of the charge control MOSFET and the charge current detection MOSFET by digital signal processing which is based on a voltage value of the charge current detection resistance, and to generate a control signal which is supplied to gates of the discharge control MOSFET and the discharge current detection MOSFET by digital signal processing which is based on a voltage value of the discharge current detection resistance.

(Note 2)

The cell protection system according to note 1, wherein the control circuit includes:

an charge current detection ADC (Analog/Digital Converter) provided in correspondence to the charge current detection MOSFET and connected with the charge current detection resistance; and a discharge current detection ADC provided in correspondence to the discharge current detection MOSFET and connected with the discharge current detection resistance.

(Note 3)

The cell protection system according to note 2, wherein the control circuit further includes:

a control section connected with the charge current detection ADC and the discharge current detection ADC, and wherein the control section is connected with the gates of the charge control MOSFET, the charge current detection MOSFET, the discharge control MOSFET and the discharge current detection MOSFET.

(Note 4)

The cell protection system according to note 1, wherein the charge control MOSFET, the charge current detection MOSFET, the discharge control MOSFET and the discharge current detection MOSFET are loaded on one chip.

(Note 5)

The cell protection system according to note 4, wherein the one chip is a configuration of CSP (Chip Size Package).

(Note 6)

The cell protection system according to note 3, wherein the control section, the charge current detection ADC, the discharge current detection ADC, the charge current detection resistance and the discharge current detection resistance are loaded on one chip.

(Note 7)

The cell protection system according to note 3, wherein the control section, the charge current detection ADC, the discharge current detection ADC, the charge current detection resistance, the discharge current detection resistance, the charge control MOSFET, the charge current detection MOSFET, the discharge control MOSFET and the discharge current detection MOSFET are loaded on one chip.

(Note 8)

The cell protection system according to note 1, wherein the charge current detection MOSFET includes a plurality of MOSFETs which have a different cell ratio from the charge control MOSFET, and wherein the discharge current detection MOSFET includes a plurality of MOSFETs which have a different cell ratio from the discharge control MOSFET.

(Note 9)

The cell protection system according to note 8, wherein the charge current detection resistance is provided in correspondence to the plurality of MOSFETs of the charge current detection MOSFET, and wherein the discharge current detection resistance is provided in correspondence to the plurality of MOSFETs of the discharge current detection MOSFET.

(Note 10)

The cell protection system according to note 9, wherein the control circuit further includes:

a charge current detection ADC (Analog/Digital Converter) provided in correspondence to a plurality of MOSFETs of the charge current detection MOSFET and connected with the charge current detection resistance; and a discharge current detection ADC provided in correspondence to the plurality of MOSFETs of the discharge current detection MOSFET and connected with the discharge current detection resistance, and wherein the number of sets of the charge current detection resistance and the charge current detection ADC is one, and the number of sets of the discharge current detection resistance and the discharge current detection ADC is one.

(Note 11)

The cell protection system according to note 8, wherein the charge current detection MOSFET contains a first MOSFET and a second MOSFET, wherein the first MOSFET has a drain and a gate which are common with the charge control MOSFET, wherein the second MOSFET has a drain which is common with the charge control MOSFET and has the drain and a source which are common with the first MOSFET, wherein the discharge current detection MOSFET contains a third MOSFET and a fourth MOSFET, wherein the third MOSFET has a drain and a gate which are common with the discharge control MOSFET, and wherein the fourth MOSFET has a drain which is common with the discharge control MOSFET, and and the drain and a source which are common with the third MOSFET.

(Note 12)

The cell protection system according to note 8, wherein the charge current detection MOSFET contains a first MOSFET and a second MOSFET, wherein the first MOSFET has a drain and a gate which are common with the charge control MOSFET, wherein the second MOSFET has a drain which is common with the charge control MOSFET and has the drain and a source which are common with the first MOSFET, wherein the discharge current detection MOSFET contains a third MOSFET and a fourth MOSFET, wherein the third MOSFET has a drain and a gate which are common with the discharge control MOSFET, and wherein the fourth MOSFET has a drain which is common with the discharge control MOSFET, and has the drain and a source which are common with the third MOSFET.

(Note 13)

The cell protection system according to note 8, wherein the charge current detection resistance includes a plurality of resistances, wherein the discharge current detection resistance includes a plurality of resistances, wherein the plurality of resistances of the charge current detection resistance are provided in correspondence to the plurality of MOSFETs of the charge current detection MOSFET, and wherein the plurality of resistances of the discharge current detection resistance are provided in correspondence to the plurality of MOSFET of the discharge current detection MOSFET.

(Note 14)

The cell protection system according to note 13, wherein the control circuit further includes:

a plurality of charge current detection ADCs (Analog/Digital Converter) provided in correspondence to the plurality of MOSFETs of the charge current detection MOSFET and connected with the plurality of resistances of the charge current detection resistance; and a plurality of discharge current detection ADCs provided in correspondence to the plurality of MOSFETs of the discharge current detection MOSFET and connected with the plurality of resistances of the discharge current detection resistance, wherein the number of sets of the charge current detection resistance and the charge current detection ADC is plural, and wherein the number of sets of the discharge current detection resistance and the discharge current detection ADC is plural.

(Note 15)

The cell protection system according to note 8, wherein the charge current detection MOSFET contains a first MOSFET and a second MOSFET, wherein the first MOSFET has a drain and a gate which are common with the charge control MOSFET, wherein the second MOSFET has a drain and a gate which are common with the charge control MOSFET, and has a drain and a gate which are common with the first MOSFET, wherein the discharge current detection MOSFET contains a third MOSFET and a fourth MOSFET, wherein the third MOSFET has a drain and a gate which are common with the discharge control MOSFET, and wherein the fourth MOSFET has a drain and a gate which are common with the discharge control MOSFET, and has a drain and a source which are common to with the third MOSFET.

(Note 16)

A cell pack includes:

a secondary battery connected with a first terminal and a second terminal by wiring lines; and a cell protection system provided in a middle of at least one of the wiring lines, wherein the cell protection system includes:

a charge control MOSFET having a source connected with the first terminal;

a charge current detection MOSFET having a drain and a gate which are connected in common with the charge control MOSFET and having a cell ratio different from that of the charge control MOSFET;

a discharge control MOSFET having a source connected with the secondary battery and having a drain common with the charge control MOSFET;

a discharge current detection MOSFET having and a drain and a gate which are common with the discharge control MOSFET and having a cell ratio different from that of the discharge control MOSFET;

a charge current detection resistance provided in correspondence to the charge current detection MOSFET;

a discharge current detection resistance provided in correspondence to the discharge current detection MOSFET; and a control circuit configured to generate a control signal to be supplied to the gates of the charge control MOSFET and the charge current detection MOSFET, by digital signal processing which is based on a voltage value of the charge current detection resistance, and generate a control signal to be supplied to the gates of the discharge control MOSFET and the discharge current detection MOSFET, by digital signal processing which is based on a voltage value of the discharge current detection resistance.

(Note 17)

The cell pack according to note 16, wherein the control circuit of the cell protection system further includes:

a charge current detection ADC (Analog/Digital Converter) provided in correspondence to the charge current detection MOSFET and connected with the charge current detection resistance; and a discharge current detection ADC provided in correspondence to the discharge current detection MOSFET and connected with the discharge current detection resistance.

(Note 18)

The cell pack according to note 17, wherein the cell protection system further includes:

a control section connected with the charge current detection ADC and the discharge current detection ADC, and wherein the control unit is connected with the gates of the charge control MOSFET, the charge current detection MOSFET, the discharge control MOSFET and the discharge current detection MOSFET.

(Note 19)

The cell pack according to note 16, wherein the charge current detection MOSFET includes a plurality of MOSFETs which are different from the charge control MOSFET in a cell ratio, and wherein the discharge current detection MOSFET includes a plurality of MOSFETs which are different from the discharge control MOSFET in a cell ratio.

(Note 20)

The cell pack according to note 19, wherein the charge current detection resistance is provided in correspondence to the plurality of MOSFETs of the charge current detection MOSFET, and wherein the discharge current detection resistance is provided in correspondence to the plurality of MOSFETs of the discharge current detection MOSFET.

(Note 21)

The cell pack according to note 20, wherein the control circuit of the cell protection system further includes:

a charge current detection ADC (Analog/Digital Converter) provided in correspondence to the plurality of MOSFETs of the charge current detection MOSFET and connected with the charge current detection resistance; and a discharge current detection ADC provided in correspondence to the plurality of MOSFETs of the discharge current detection MOSFET and connected with the discharge current detection resistance, wherein the number of sets of the charge current detection resistance and the charge current detection ADC is one, and wherein the number of sets of the discharge current detection resistance and the discharge current detection ADC is one.

(Note 22)

The cell pack according to note 19, wherein the charge current detection MOSFET contains a first MOSFET and a second MOSFET, wherein the first MOSFET has a drain and a gate which are common with the charge control MOSFET, wherein the second MOSFET has a drain common with the charge control MOSFET, and having a drain and a source which are common with the first MOSFET, wherein the discharge current detection MOSFET contains a third MOSFET and a fourth MOSFET, wherein the third MOSFET has a drain and a gate which are common with the discharge control MOSFET, and wherein the fourth MOSFET a drain and a source which are common with the discharge control MOSFET and a drain common with the third MOSFET.

(Note 23)

The cell pack according to note 19, wherein the charge current detection MOSFET contains a first MOSFET and a second MOSFET, wherein the first MOSFET has a drain and a gate which are common with the charge control MOSFET, wherein the second MOSFET has a drain common with the charge control MOSFET and has a drain and a source which are common with the first MOSFET, wherein the discharge current detection MOSFET contains a third MOSFET and a fourth MOSFET, wherein the third MOSFET has a drain and a gate which are common with the discharge control MOSFET, and wherein the fourth MOSFET has a drain common with the discharge control MOSFET and has a drain and a source which are common with the third MOSFET.

(Note 24)

The cell pack according to note 19, wherein the charge current detection resistance includes a plurality of resistances, wherein the discharge current detection resistance includes a plurality of resistances, wherein the plurality of resistances of the charge current detection resistance is provided in correspondence to the plurality of MOSFETs of the charge current detection MOSFET, and wherein the plurality of resistances of the discharge current detection resistance is provided in correspondence to the plurality of MOSFETs of the discharge current detection MOSFET.

(Note 25)

The cell pack according to note 24, wherein the control circuit of the cell protection system further includes:

a plurality of charge current detection ADCs (Analog/Digital Converters) provided in correspondence to the plurality of MOSFETs of the charge current detection MOSFET and connected with the plurality of resistances of the charge current detection resistance; and a plurality of discharge current detection ADCs provided in correspondence to the plurality of MOSFETs of the discharge current detection MOSFET and connected with the plurality of resistances of the discharge current detection resistance, wherein the number of sets of the charge current detection resistance and the charge current detection ADC is plural, and wherein the number of sets of the discharge current detection resistance and the discharge current detection ADC is plural.

(Note 26)

The cell pack according to note 19, wherein the charge current detection MOSFET contains a first MOSFET and a second MOSFET, wherein the first MOSFET has a drain and a gate which are common with the charge control MOSFET, wherein the second MOSFET has a drain and a gate which are common with the charge control MOSFET, and has a drain and a gate which are common with the first MOSFET, wherein the discharge current detection MOSFET contains a third MOSFET and a fourth MOSFET, wherein the third MOSFET has a drain and a gate which are common with the discharge control MOSFET, and wherein the fourth MOSFET has a drain and a gate which are common with the discharge control MOSFET and has a drain and a source which are common with the third MOSFET.

(Note 27)

An operation method of a cell pack, including:

preparing a cell pack, wherein the cell pack includes a secondary battery connected with a first terminal and a second terminal with wiring lines; and a cell protection system provided in a middle of at least one of the wiring lines, wherein the cell protection system includes:

a charge control MOSFET having a source connected with the first terminal;

a charge current detection MOSFET having a drain and a gate which are common with the charge control MOSFET and having a cell ratio different that of the charge control MOSFET;

a discharge control MOSFET having a source connected with the secondary battery and having a drain common with the charge control MOSFET;

a discharge current detection MOSFET having a drain and a gate which are common with the discharge control MOSFET and having a cell ratio different from that of the discharge control MOSFET;

a charge current detection resistance provided in correspondence to the charge current detection MOSFET; and a discharge current detection resistance provided in correspondence to the discharge current detection MOSFET;

turning on the charge control MOSFET, the charge current detection MOSFET and the discharge control MOSFET;

measuring a first voltage of the charge current detection resistance;

calculating a charge current of the secondary battery based on the first voltage; and generating a control signal to be supplied to the gates of the charge control MOSFET and the charge current detection MOSFET based on the charge current.

(Note 28)

The operation method according to note 27, further including:

turning on the discharge control MOSFET, the discharge current detection MOSFET and the charge control MOSFET;

measuring a second voltage of the discharge current detection resistance;

calculating the discharge current of the secondary battery based on the second voltage; and generating a control signal to be supplied to the gates of the discharge control MOSFET and the discharge current detection MOSFET based on the discharge current.

The invention accomplished by the inventor has been specifically described based on the embodiments and the modification examples. However, the present invention is not limited to the embodiments and the modification examples and various modifications are possible in a range which does not deviate from the scope of the invention. Also, it is possible to combine the embodiments and the modification examples in a range with no contradiction.

What is claimed is:

1. A cell protection system comprising:
   a charge control MOSFET;
   a charge current detection MOSFET having a drain and a gate which are common with the charge control MOSFET and having a cell ratio which is different from that of the charge control MOSFET;
   a discharge control MOSFET having a drain common with the charge control MOSFET;
   a discharge current detection MOSFET having a drain and a gate which are common with the discharge control MOSFET and having a cell ratio which is different from that of the discharge control MOSFET;
   a charge current detection resistance provided in correspondence to the charge current detection MOSFET;
   a discharge current detection resistance provided in correspondence to the discharge current detection MOSFET;
   an charge current detection ADC (Analog/Digital Converter) provided in correspondence to the charge current detection MOSFET and connected with the charge current detection resistance;
   a discharge current detection ADC provided in correspondence to the discharge current detection MOSFET and connected with the discharge current detection resistance; and
   a control circuit configured to generate a control signal which is supplied to gates of the charge control MOSFET and the charge current detection MOSFET according to a voltage value of the charge current detection ADC, and to generate a control signal which is supplied to gates of the discharge control MOSFET and the discharge current detection MOSFET according to a voltage value of the discharge current detection ADC.

2. The cell protection system according to claim 1, wherein the control circuit further comprises:
   a control section connected with the charge current detection ADC and the discharge current detection ADC, and
   wherein the control section is connected with the gates of the charge control MOSFET, the charge current detection MOSFET, the discharge control MOSFET and the discharge current detection MOSFET.

3. The cell protection system according to claim 2, wherein the control section, the charge current detection ADC, the discharge current detection ADC, the charge current detection resistance and the discharge current detection resistance are loaded on one chip.

4. The cell protection system according to claim 2, wherein the control section, the charge current detection ADC, the discharge current detection ADC, the charge current detection resistance, the discharge current detection resistance, the charge control MOSFET, the charge current detection MOSFET, the discharge control MOSFET and the discharge current detection MOSFET are loaded on one chip.

5. The cell protection system according to claim 1, wherein the charge control MOSFET, the charge current detection MOSFET, the discharge control MOSFET and the discharge current detection MOSFET are loaded on one chip.

6. The cell protection system according to claim 5, wherein the one chip is of a CSP (Chip Size Package) configuration.

7. The cell protection system according to claim 1, wherein the charge current detection MOSFET comprises a plurality of MOSFETs which are different from the charge control MOSFET in the cell ratio, and
   wherein the discharge current detection MOSFET comprises a plurality of MOSFETs which are different from the discharge control MOSFET in the cell ratio.

8. The cell protection system according to claim 7, wherein the charge current detection resistance is provided in correspondence to the plurality of MOSFETs of the charge current detection MOSFET, and
   wherein the discharge current detection resistance is provided in correspondence to the plurality of MOSFETs of the discharge current detection MOSFET.

9. The cell protection system according to claim 8, wherein the control circuit further comprises: a charge current detection ADC (Analog/Digital Converter) provided in correspondence to a plurality of MOSFETs of the charge current detection MOSFET and connected with the charge current detection resistance; and
   a discharge current detection ADC provided in correspondence to a plurality of MOSFETs of the discharge current detection MOSFET and connected with the discharge current detection resistance, and
   wherein the number of sets of the charge current detection resistance and the charge current detection ADC is one, and the number of sets of the discharge current detection resistance and the discharge current detection ADC is one.

10. The cell protection system according to claim 7, wherein the charge current detection MOSFET contains a first MOSFET and a second MOSFET, wherein the first MOSFET has a drain and a gate which are common with the charge control MOSFET, wherein the second MOSFET has a drain which is common with the charge control MOSFET and has the drain and a source which are common with the first MOSFET, wherein the discharge current detection MOSFET contains a third MOSFET and a fourth MOSFET, wherein the third MOSFET has a drain and a gate which are common with the discharge control MOSFET, and wherein the fourth MOSFET has a drain which is common with the discharge control MOSFET, and the drain and a source which are common with the third MOSFET.

11. The cell protection system according to claim 7, wherein the charge current detection MOSFET comprises a first MOSFET and a second MOSFET, wherein the first MOSFET has a drain and a gate which are common with the charge control MOSFET, wherein the second MOSFET has a drain which is common with the charge control MOSFET and has the drain and a source which are common with the first MOSFET, wherein the discharge current detection MOSFET contains a third MOSFET and a fourth MOSFET, wherein the third MOSFET has a drain and a gate which are common with the discharge control MOSFET, and wherein the fourth MOSFET has a drain which is common with the discharge control MOSFET, and has the drain and a source which are common with the third MOSFET.

12. The cell protection system according to claim 7, wherein the charge current detection resistance comprises a plurality of resistances, and the discharge current detection resistance comprises a plurality of resistances, wherein the plurality of resistances of the charge current detection resistance are provided in correspondence to the plurality of MOSFETs of the charge current detection MOSFET, and wherein the plurality of resistances of the discharge current detection resistance are provided in correspondence to the plurality of MOSFETs of the discharge current detection MOSFET.

13. The cell protection system according to claim 12, wherein the control circuit further comprises:

a plurality of charge current detection ADCs (Analog/Digital Converter) provided in correspondence to the plurality of MOSFETs of the charge current detection MOSFET and connected with the plurality of resistances of the charge current detection resistance; and a plurality of discharge current detection ADCs provided in correspondence to the plurality of MOSFETs of the discharge current detection MOSFET and connected with the plurality of resistances of the discharge current detection resistance, wherein the number of sets of the charge current detection resistance and the charge current detection ADC is plural, and wherein the number of sets of the discharge current detection resistance and the discharge current detection ADC is plural.

14. The cell protection system according to claim 7, wherein the charge current detection MOSFET comprises a first MOSFET and a second MOSFET, wherein the first MOSFET has a drain and a gate which are common with the charge control MOSFET, wherein the second MOSFET has a drain and a gate which are common with the charge control MOSFET, and has a drain and a gate which are common with the first MOSFET, wherein the discharge current detection MOSFET comprises a third MOSFET and a fourth MOSFET, wherein the third MOSFET has a drain and a gate which are common with the discharge control MOSFET, and wherein the fourth MOSFET has a drain and a gate which are common with the discharge control MOSFET, and has a drain and a source which are common to with the third MOSFET.

* * * * *